(12) United States Patent  
Walworth

(10) Patent No.: US 8,487,430 B1
(45) Date of Patent: Jul. 16, 2013

(54) MULTI-LAYER HIGH-SPEED INTEGRATED CIRCUIT BALL GRID ARRAY PACKAGE AND PROCESS

(75) Inventor: Darren Jay Walworth, Fullerton, CA (US)

(73) Assignee: Semtech Corporation, Camarillo, CA (US)

( * ) Notice: Subject to any disclaimer, the term of this patent is extended or adjusted under 35 U.S.C. 154(b) by 513 days.

(21) Appl. No.: 12/691,675

(22) Filed: Jan. 21, 2010

(51) Int. Cl.
    *H01L 23/64* (2006.01)
(52) U.S. Cl.
    USPC ........... 257/728; 257/698; 257/664; 257/700; 257/E23.01
(58) Field of Classification Search
    USPC .......... 257/664, 728, 700, 698, 678, E23.061, 257/E23.01, E23.001
    See application file for complete search history.

(56) References Cited

U.S. PATENT DOCUMENTS

| | | | |
|---|---|---|---|
| 6,239,385 B1 * | 5/2001 | Schwiebert et al. | 174/261 |
| 6,710,258 B2 * | 3/2004 | Oggioni et al. | 174/255 |
| 7,535,321 B1 | 5/2009 | Degerstrom et al. | |
| 2006/0158280 A1 * | 7/2006 | Jow et al. | 333/33 |
| 2009/0026608 A1 * | 1/2009 | Tsai et al. | 257/737 |

* cited by examiner

*Primary Examiner* — David Vu
*Assistant Examiner* — Sitaramarao S Yechuri
(74) *Attorney, Agent, or Firm* — McDermott Will & Emery LLP

(57) ABSTRACT

Examples of high-speed ball grid array packages and a process of forming a package are provided. A package may include contact pads disposed on a bottom surface, conductive balls, and a signal via structure. The package may also include a first ground via structure arranged along one or more first semi-circular contours around the signal via structure and extending vertically and a second ground via structure arranged along one or more second semi-circular contours around the signal via structure and extending vertically. The package may include a ground interface plane disposed in separation from the signal contact pad by a distance. The distance may be determined based on at least a size of the signal contact pad, a dielectric constant of a transition layer between the ground interface plane and the signal contact pad, and a distance between the signal via structure and the second ground via structure.

17 Claims, 20 Drawing Sheets

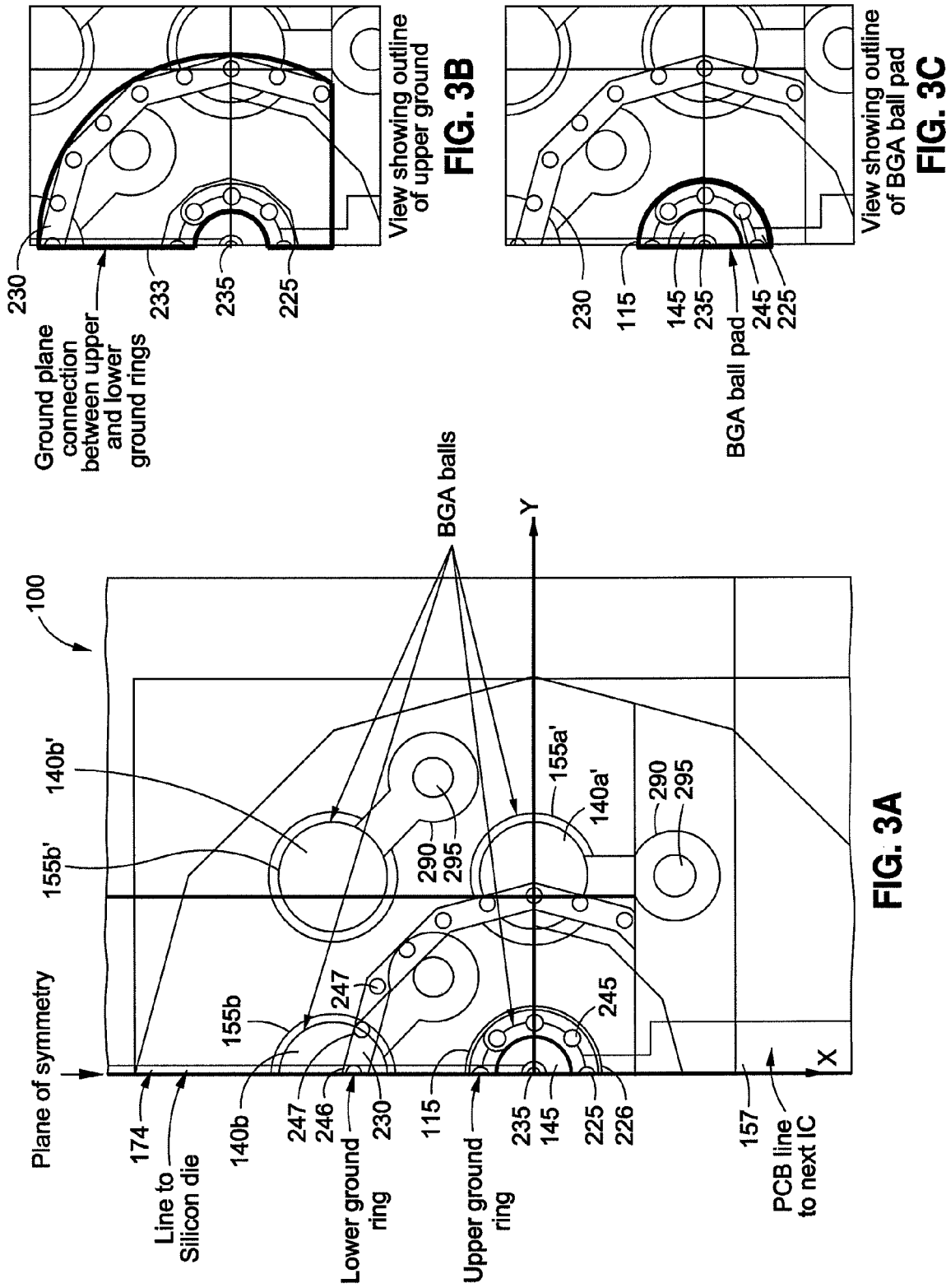

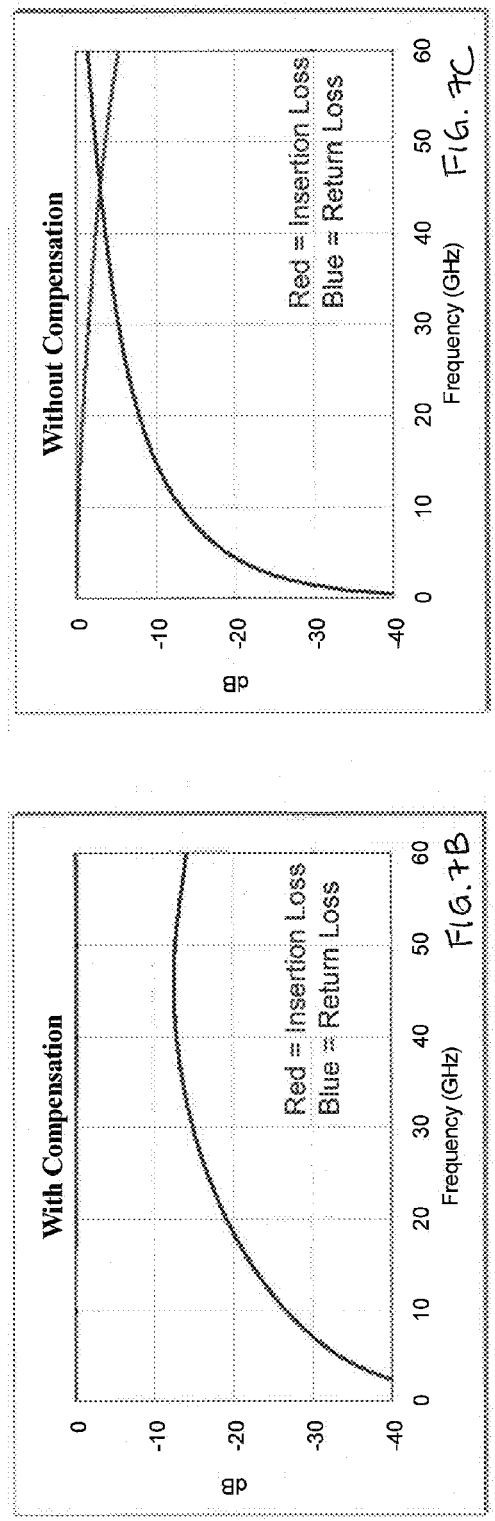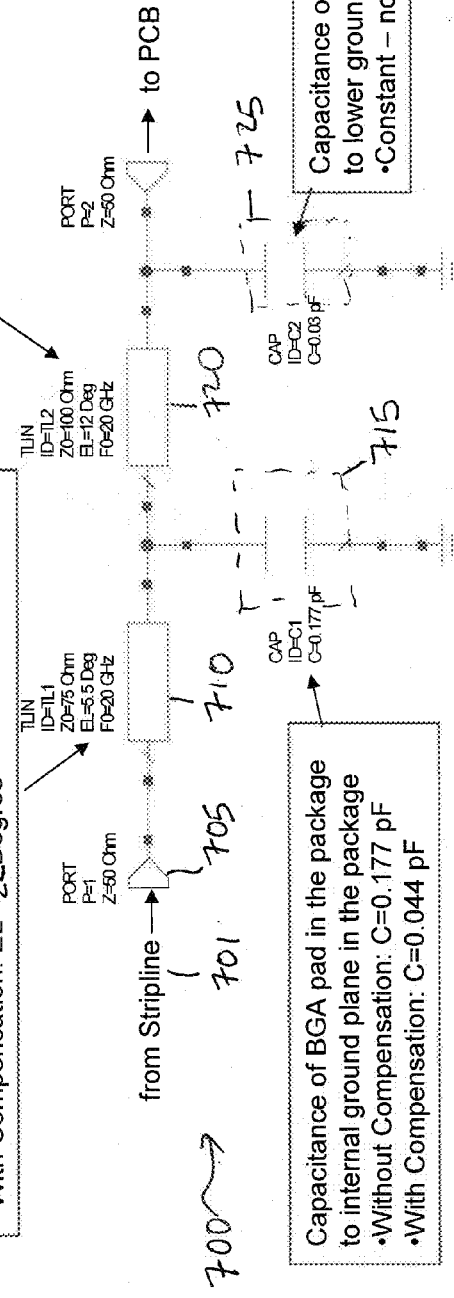

MULTI-LAYER HIGH-SPEED INTEGRATED CIRCUIT BALL GRID ARRAY PACKAGE AND PROCESS

FIELD

The subject disclosure relates to circuit packages, and more particularly, to multi-layer high-speed ball grid array packages.

BACKGROUND

Integrated circuit (IC) packages employing ball grid arrays are moving toward denser ball grid array designs. In one aspect, ball grid arrays may be used in IC packages to provide connections for increasing data rates. One problem associated with IC packages designed for higher data rates is that signal integrity may degrade as the data rate increases. In addition, a manufacturer may need to balance the need to modify an IC package to provide higher data rates with the requirements of maintaining uniformity within vendor part specifications. Customizing individual components of an IC package may not be cost-effective and/or may not be compatible with higher-level systems.

SUMMARY

In one aspect of the disclosure, a ball grid array package may comprise a package board, comprising a plurality of transition layers that are dielectric. The ball grid array package may comprise a plurality of contact pads disposed on a bottom surface of the package board, a plurality of conductive balls, a signal line disposed in an upper portion of the package board, and a signal via structure. The plurality of contact pads are conductive, and each of the plurality of conductive balls is directly connected to a respective one of the plurality of contact pads. The signal line is conductive and for carrying a signal. The signal via structure may couple the signal line to a first one of the plurality of contact pads through at least some of the plurality of transition layers, the signal via structure being conductive and for carrying a signal.

The ball grid array package may comprise a first ground via structure arranged along one or more first semi-circular contours around the signal via structure, the first ground via structure extending vertically through one or more of the plurality of transition layers in the upper portion of the package board, the first ground via structure coupled to one or more ground contact pads of the plurality of contact pads, the first ground via structure for providing ground.

The ball grid array package may comprise a second ground via structure arranged along one or more second semi-circular contours around the signal via structure, the second ground via structure extending vertically through one or more of the plurality of transition layers in a lower portion of the package board, the second ground via structure coupled to one or more ground contact pads of the plurality of contact pads, the second ground via structure for providing ground.

The ball grid array package may comprise a ground interface plane disposed between the first ground via structure and the second ground via structure, the ground interface plane coupled to the first ground via structure and the second ground via structure, the ground interface plane for providing ground. A portion of the ground interface plane may be disposed to overlap a portion of the first one of the plurality of contact pads.

The ground interface plane may be disposed in separation from the first one of the plurality of contact pads by a distance, where the distance is determined based on at least a size of the first one of the plurality of contact pads, a dielectric constant of a transition layer between the ground interface plane and the first one of the plurality of contact pads, and a distance between the signal via structure and the second ground via structure. The portion of the ground interface plane and the portion of the first one of the plurality of contact pads that overlap may be immediately adjacent conductive portions.

In another aspect of the disclosure, an integrated circuit chip package may comprise an integrated circuit chip. The package may also comprise a package board, wherein the integrated circuit chip is mounted onto a top surface of the package board, wherein the package board is configured to send or receive a signal at a frequency greater than 10 GHz.

The package board may comprise a first impedance section configured to provide a first characteristic impedance, the first impedance section disposed in an upper portion of the package board. The first impedance section may comprise a signal line, one or more ground planes disposed vertically adjacent to the signal line, and one or more transition layers that are dielectric. The one or more transition layers may be disposed among the signal line and the one or more ground planes. The first impedance section may comprise a first set of signal vias coupled to the signal line and a first set of first ground vias disposed parallel to the first set of signal vias at a first radius from the first set of signal vias, the first set of first ground vias being disposed in one or more transition layers in the upper portion of the package board, the first set of first ground vias coupled to at least one of the one or more ground planes.

The package board may comprise a second impedance section configured to provide a second characteristic impedance, the second impedance section disposed in a lower portion of the package board. The second impedance section may comprise a ground interface plane, a second set of signal vias vertically coupled to the first set of signal vias, and one or more transition layers that are dielectric. The second impedance section may comprise a first set of second ground vias disposed parallel to the second set of signal vias at a second radius from the second set of signal vias, the first set of second ground vias being disposed in one or more transition layers in the lower portion of the package board. The second impedance section may comprise a plurality of contact pads disposed on a bottom surface of the package board, the plurality of contact pads being conductive, the plurality of contact pads comprising a signal contact pad and ground contact pads. The ground interface plane may be disposed between the first set of first ground vias and the first set of second ground vias and coupled to the first set of first ground vias and to the first set of second ground vias. The second set of signal vias may be connected to the signal contact pad. The first set of second ground vias may be connected to the ground contact pads.

The package may also comprise a plurality of conductive balls, each of the plurality of conductive balls directly connected to a respective one of the plurality of contact pads. A position of the first set of second ground vias relative to a position of the second set of signal vias and a position of the signal contact pad relative to a position of the ground interface plane may be configured to provide the second characteristic impedance that substantially matches the first characteristic impedance at a signal frequency greater than 10 GHz.

In another aspect of the disclosure, a method of fabricating a ball grid array package may comprise one or more of the following: forming a plurality of transition layers juxtaposed one on another in a package board, the plurality of transition layers being dielectric; forming a signal line in an upper portion of the package board; forming one or more ground planes in the upper portion of the package board; forming a signal via structure connected to the signal line; forming a first ground via structure arranged along one or more first semi-circular contours around the signal via structure, the first ground via structure extending vertically through one or more of the plurality of transition layers in the upper portion of the package board; forming a ground interface plane; forming a second ground via structure arranged along one or more second semi-circular contours around the signal via structure, the second ground via structure extending vertically through one or more of the plurality of transition layers in a lower portion of the package board; forming a plurality of contact pads on a bottom surface of the package board, the plurality of contact pads being conductive, the plurality of contact pads comprising a signal contact pad and ground contact pads; and forming a plurality of conductive balls, each of the plurality of conductive balls directly connected to a respective one of the plurality of contact pads.

The first ground via structure may be coupled to the one or more ground planes, where the ground interface plane may be coupled to the first ground via structure, where the second ground via structure may be coupled to the ground interface plane, and where the ground contact pads may be coupled to the second ground via structure.

The ground interface plane may be disposed between the first ground via structure and the second ground via structure. The signal via structure may be connected to the signal contact pad. A portion of the ground interface plane may be disposed to overlap a portion of the signal contact pad.

The ground interface plane may be disposed in separation from the signal contact pad by a distance, where the distance may be determined based on at least a size of the signal contact pad, a dielectric constant of a transition layer between the ground interface plane and the signal contact pad, and a distance between the signal via structure and the second ground via structure. The portion of the ground interface plane and the portion of the signal contact pad that overlap may be immediately adjacent conductive portions.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

FIG. 3A is a top plan view illustrating different layers of a ball grid array package in accordance with an aspect of the subject technology.

FIG. 3B is an enlarged view highlighting an exemplary ground interface plane.

FIG. 3C is an enlarged view highlighting an exemplary upper ground ring.

FIG. 7A is a schematic circuit representation of components of a ball grid array package in accordance with an aspect of the subject technology.

FIGS. 7B and 7C are exemplary plots illustrating a comparison of signal quality of a ball grid array package employing an aspect of the subject technology and a ball grid array package not employing the subject technology.

DETAILED DESCRIPTION

Figure 1A:
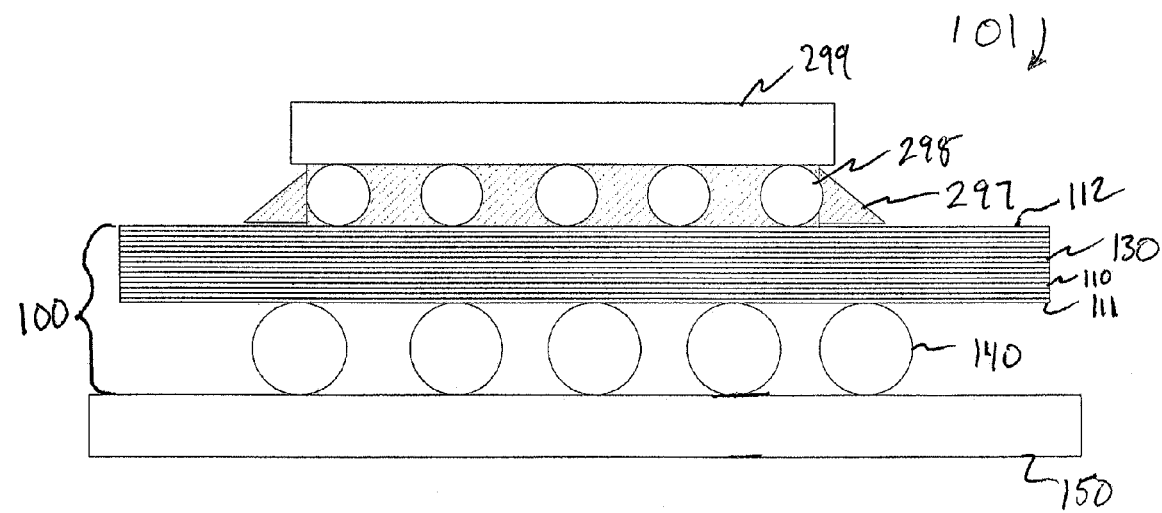
FIG. 1A is a side view illustrating an example of an integrated circuit chip assembly in accordance with an aspect of the subject technology.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like or similar components are labeled with identical element numbers for ease of understanding.

The design of IC packages may typically include balancing electrical characteristics amongst a dense arrangement of elements in a package while employing industry standard component sizes. In one advantageous and important aspect, some components, for example, each of the package board layers, may have the same thickness to minimize costs associated with customization of the board layers and for compatibility with other components in other system levels.

In one aspect, some IC packages may be designed for relatively high-speed data transmissions. In one exemplary IC package design, a ball grid array (BGA) assembly may be employed accommodating a high density of input/output signal ports (including control signal ports). The density of input and output ports may be related to the number of conductive balls employed.

In a typical ball grid array assembly, the number of balls (e.g., BGA balls) used may be controlled by the ball-to-ball pitch spacing available on a substrate. The closer the balls are to one another, the more signal ports may be used. However, as the ball pitch becomes finer, related electrical components may also need to be arranged closer together. For example, some contact pads may be positioned closer together as a result of higher density ball pitch. In addition, some conductive vias coupled to contact pads may be positioned relatively closely.

In one aspect, the arrangement of adjacent electrical components may involve impedance matching throughout a ball grid array assembly. A ball grid array assembly employing substantially constant impedance (e.g., 50 ohms+/−5 ohms throughout the high-speed signal paths for carrying signals at a frequency between 20 and 40 GHz) may provide efficient signal transmission. For example, when a signal is routed through a package to an underlying contact pad, the impedance near the contact pad may not be the same as an impedance in an overlying section of the signal path. To compensate for mismatching impedance sections, conductive components in the underlying section of the signal path may need to be within a range of electrical length where the components are electrically visible to one another. However, at high frequency signal transmissions, shortening the distance between two conductive components may contribute to parasitic phenomena on the signal. For example, a contact pad and another conductive component proximate the contact pad, when positioned within a relatively close electrical length to one another, may produce a capacitance that may affect the integrity of a signal routed to the contact pad.

Referring to FIG. 1A, an example of an integrated circuit chip assembly 101 is shown. In one aspect, the integrated circuit chip assembly 101 is configured for high-speed data transmission rates of approximately 20 gigabytes per second (Gb/s) or more. For example, the integrated circuit chip assembly 101 may employ data transmission rates in a range of 20 Gb/s to 40 Gb/s. Data transmission rates may also be referred to in terms of frequency. For example, a 20 Gb/s signal may also be referred to as a 20-gigahertz (GHz) signal. The integrated circuit chip assembly 101 may include a ball grid array assembly 100 and a silicon die chip 299 mounted onto the ball grid array assembly 100. The ball grid array assembly 100 may generally comprise a package board 130 including a plurality of transition layers 110. A plurality of conductive balls 140 may be coupled underneath the package board 130.

The transition layers 110 may be made of a dielectric material. The dielectric material may be ceramic, for example, a low temperature co-fired ceramic (LTCC). In one aspect, each of the transition layers 110 may be substantially uniform in thickness across its layer, and each of the transition layers 110 may be substantially of the same thickness from one layer to another layer. In one aspect, each of the transition layers 110 may have the same thickness that is between 0.1 mm and 0.2 mm. In another aspect, each of the transition layers 110 may preferably have the same thickness that is between 0.1 mm and 0.15 mm. Having the same thickness may, among others, simplify the manufacturing steps, lower the manufacturing cost, create uniform via structures (e.g., the diameter of vias), and simplify the design complexity of the BGA assembly. In another example, the transition layers 110 may have different thicknesses.

In one exemplary configuration of the integrated circuit chip assembly 101, a flip chip design may be employed. The silicon die chip 299 may be positioned over and coupled to a plurality of solder balls 298. The solder balls 298 may be coupled to a top surface 112 of the package board 130. The silicon die chip 299 may be electrically connected to an underlying substrate 150 through the solder balls 298 and the ball grid array assembly 100. An underfill 297 may insulate the solder balls 298 from one another and other unintended connections. A substrate 150 may be, for example, a host printed circuit board (PCB).

In one aspect, the density of conductive balls 140 on the bottom surface 111 of the package board 130 may be configured for high-speed applications. For example, the conductive balls 140 may have a diameter measuring approximately 0.3 mm to 1 mm. In these examples, the conductive balls 140 may be positioned on the bottom surface 111 of the package board 130 with a ball-to-ball pitch of approximately 0.5 mm to 1.5 mm, respectively. In one preferred example of a ball grid array assembly 100, a conductive ball 140 with a standard diameter size of approximately 0.635 mm and a standard ball-to-ball pitch size of approximately 1 mm may be used. The ball-to-ball pitch may depend on the size of the substrate they are attached to and the diameter size of the conductive balls 140. For example, a 20 mm-by-20 mm package board supporting a nineteen-by-nineteen array (or a larger array) of 0.635 mm diameter conductive balls may have a ball-to-ball pitch of approximately 1 mm. In one aspect, it is preferable to use standard ball-to-ball pitch size and standard ball size.

In one aspect, conductive balls may be sometimes referred to as solder balls or ball grid array (BGA) balls. In one aspect, a ball grid array (BGA) assembly may be sometimes referred to as a BGA package, an IC assembly or an IC package, and vice versa. A BGA assembly may be a package that includes an integrated circuit chip (e.g., 299), its connectors (e.g., 298) and/or a substrate (e.g., 150).

In one example, a package board 130 may include multiple conductive layers. A first conductive layer of the board 130 may include contact pads (e.g., flip chip contact pads) and/or other conductive traces for connecting to an IC chip. The package board 130 may also comprise a second conductive layer (e.g., FIG. 10) that includes one or more ground planes, a third conductive layer (e.g., FIG. 11) that includes signal lines and/or ground traces such as ground rings, a fourth conductive layer (e.g., FIG. 12) that includes one or more ground planes, a fifth conductive layer (e.g., FIG. 13) that includes one or more power planes and/or one or more ground interface planes, and a sixth conductive layer (e.g., FIG. 14) that includes one or more power planes and/or one or more ground rings. The board 130 may further comprise a seventh conductive layer that includes power control traces/contacts and one or more ground rings, an eighth conductive layer that includes control traces/contacts and one or more ground rings, and a ninth conductive layer (e.g., FIG. 15) that includes contact pads for BGA balls and one or more ground planes. The package board 130 may also include multiple non-conductive layers (e.g., one non-conductive layer between two adjacent conductive layers).

Figure 1B:
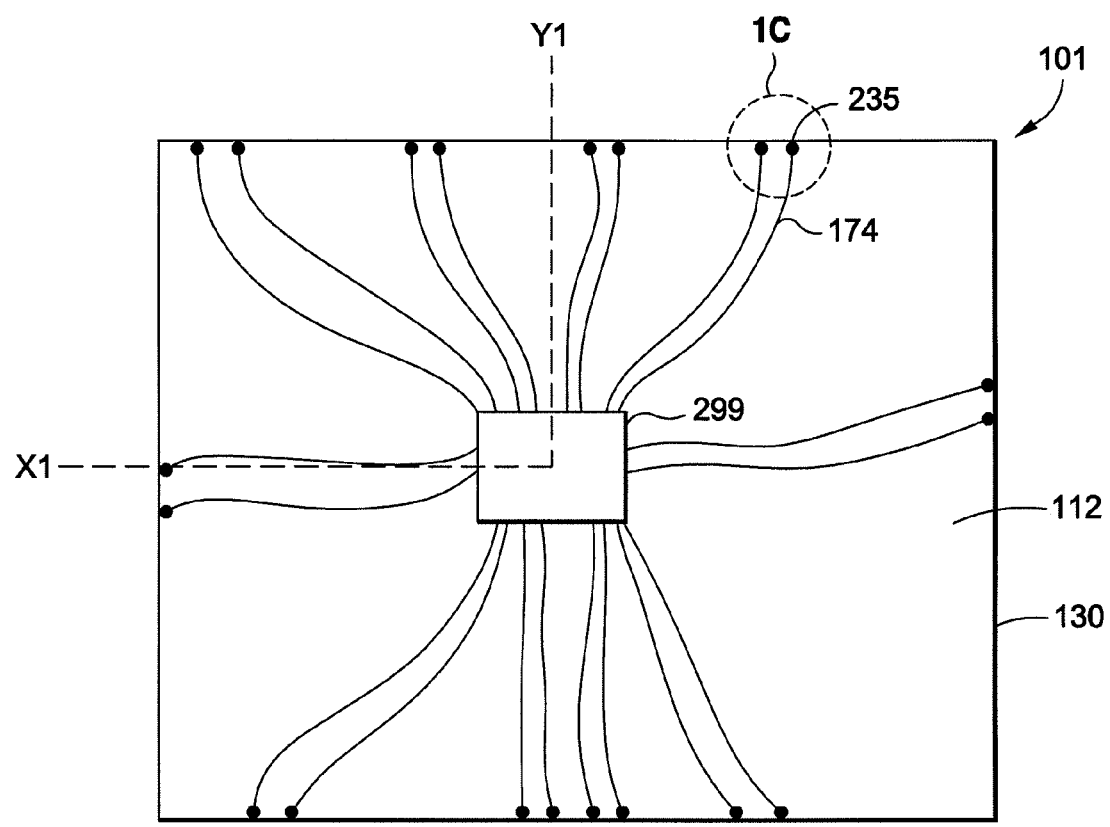
FIG. 1B is an example of a top plan view of an integrated circuit chip assembly in accordance with an aspect of the subject technology as seen from above.

Referring to FIG. 1B, a silicon die chip 299 may be approximately centered on the top surface 112 of the package board 130. In one example, the silicon die chip 299 may be greater than 3 mm by 3 mm in area (e.g., 5 mm by 5 mm), and the package board 130 may be greater than 10 mm by 10 mm in area (e.g., 20 mm by 20 mm) and support greater than a ten-by-ten array of contact pads. A plurality of signal lines 174 may originate from the silicon die chip 299, fan out toward the edges of the top surface 112, and be coupled to respective conductive vias 235. The vias 235 may extend vertically through the board 130 from the top surface 112 to the bottom surface 111 (as shown in FIG. 1A). In one aspect, the signal lines 174 may be arranged in differential pairs. The differential pairs of signal lines 174 may be employed to transmit and receive signals. For example, four pairs of signal lines 174 may be configured to transmit high-speed output signals (e.g., each line at 28 Gb/s). Ten pairs of signal lines 174 may be configured to receive high-speed input signals (e.g., each line at 10 Gb/s).

Figure 1C:
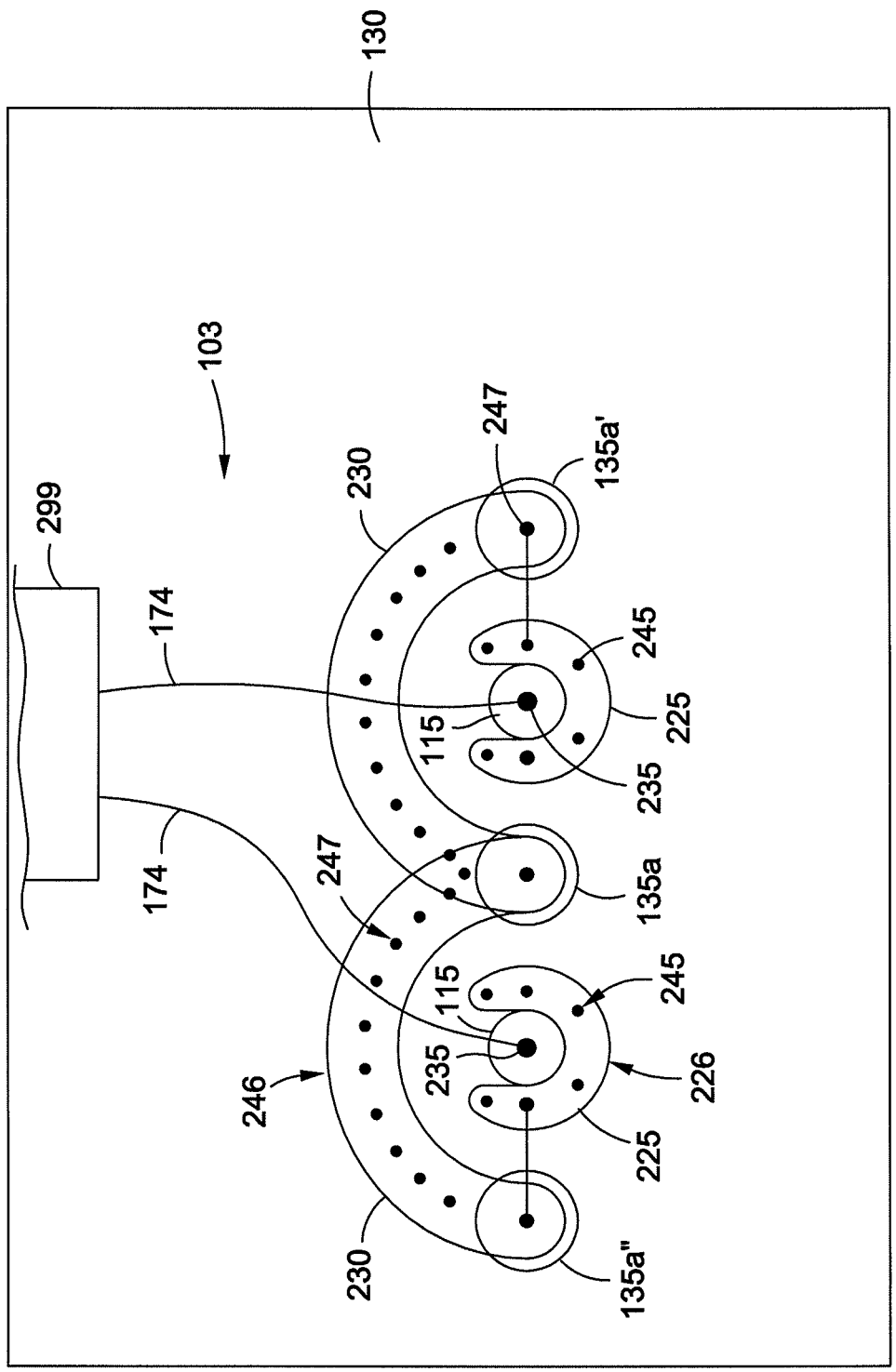
FIG. 1C is an illustration of an exemplary integrated circuit chip assembly including a differential pair of signals in a quasi-coaxial configuration as seen from above.

An enlarged view of the area 1C of FIG. 1B is shown in FIG. 1C. FIG. 1C is a conceptual diagram that illustrates a composite top plan view of various layers of an IC chip assembly. A differential pair of conductive signal lines 174 is disposed between, and is coupled to, a chip 299 and vias 235. The vias 235 may be disposed vertically through the board 130. The vias 235 may be conductive vias (e.g., metal). For the sake of illustration, the following disclosure will be described in the context of a single signal line 174; however, it will be understood that multiple signal lines 174 may be employed in accordance with aspects of the subject technology.

At relatively high frequencies, for example, from 20 GHz to approximately 40 GHz, the impedance along a signal path as it transitions through the package board 130 (e.g., signal lines to vias, to contact pads and to conductive balls) may be controlled and matched in accordance with aspects of the subject technology. In one aspect, a signal path may include a signal line 174 and vias 235 in the package board 130 surrounded by a quasi-coaxial ground configuration. Multiple vias 245 may be arranged along a semi-circular upper ground ring 225 around a via 235. Vias 245 may extend vertically through the board 130. Multiple vias 247 may be arranged along a second semi-circular lower ground ring 230 around a via 235. Vias 247 may extend vertically through the board 130.

In one aspect, vias 245 may be arranged in an opposing semi-circular configuration with respect to vias 247 to surround a via 235 in a quasi-concentric arrangement. In one aspect, a lower ground ring 230 may have a larger diameter than an upper ground ring 225. One or more vias or a set of vias may be sometimes referred to as a via structure. A set of vias may include one or more vias. A via structure may include one or more vias.

A via structure 245 or 247 may include a plurality of vias positioned parallel and lateral to one another to form a semi-circular shape of a ring. Additionally, while the upper ground ring 225 and the lower ground ring 230 are described as semi-circular, in one aspect, the upper ground ring 225 and the lower ground ring 230 may be configured as a full ring or a partially-open ring. As will be described further below, various components shown in FIG. 1C may be disposed on different layers of a ball grid array assembly.

An apex 226 of an upper ground ring 225 may be disposed in an opposite position of an open end of the ring 225. An apex 246 of a lower ground ring 230 may be disposed in an opposite position of an open end of the ring 230. An apex 226 may be disposed in an opposite location of an apex 246.

Figure 2A:
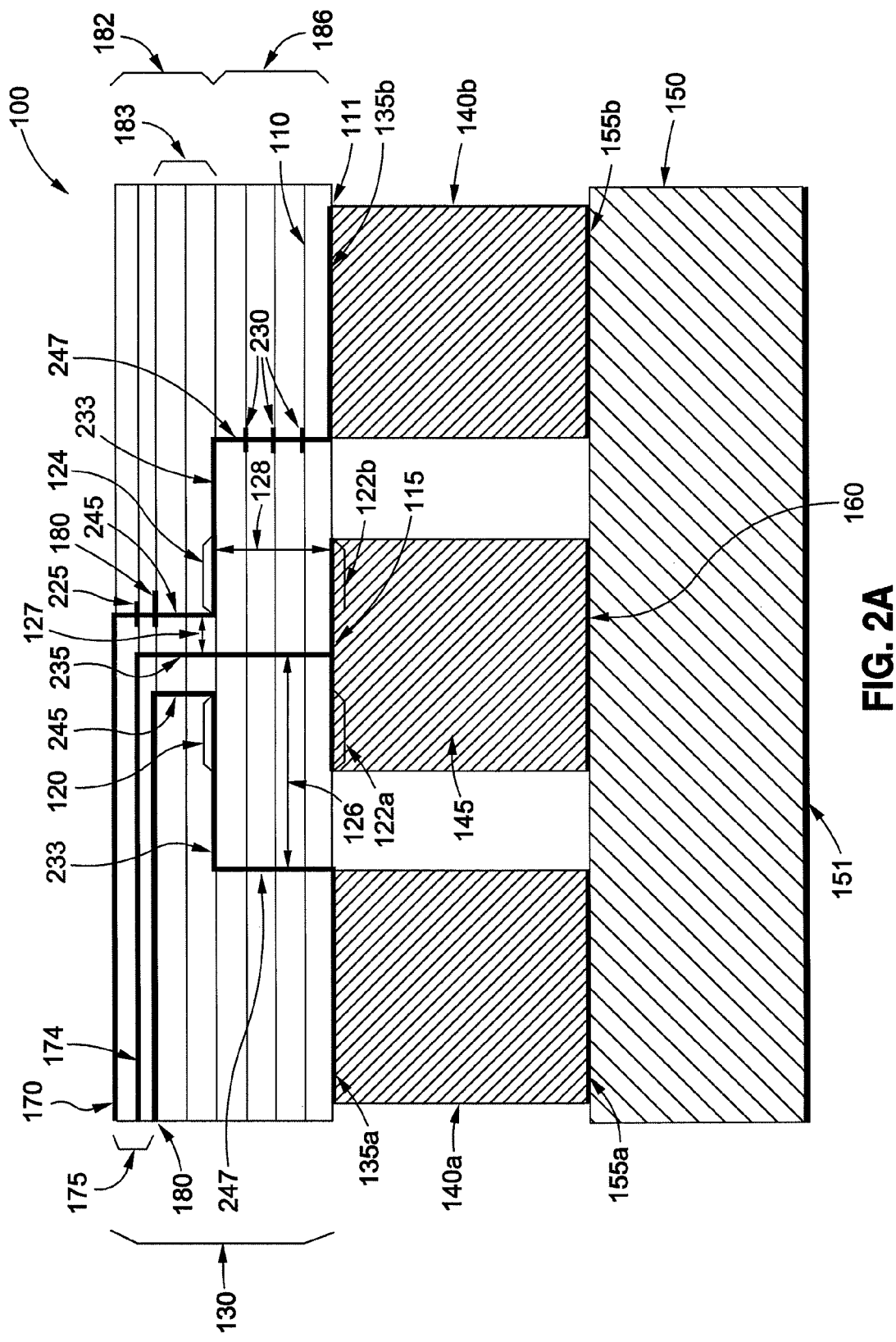
FIG. 2A is a cross-sectional side view illustrating an example of a ball grid array assembly in accordance with an aspect of the subject technology.

Referring now to FIG. 2A, a conceptual diagram of a ball grid array assembly 100 is illustrated showing exemplary conductive paths of a signal and ground through the package board 130 to contact pads and conductive balls. In one aspect, the ball grid array assembly 100 may include a stripline 175 in an upper portion 182 of the package board 130. The stripline 175 may include a signal line 174 disposed between an upper ground plane 170 and a lower ground plane 180. A signal path in the upper portion 182 may be considered a transmission line.

The package board 130 may include a plurality of conductive contact pads 135a, 115, and 135b on the bottom surface 111 of the package board 130. A contact pad may be sometimes referred to as a ball attach pad or a package ball pad. In one aspect, contact pad 115 is used for carrying a high-speed signal, and contact pads 135a and 135b are used for ground, and the contact pads 135a and 135b may be part of a large piece of a ground plane disposed on the bottom surface 111. In another aspect, the conductive contact pads 135a, 115, and 135b may be the same type of pad but are labeled differently for the sake of illustration.

A plurality of conductive balls 140a, 145, and 140b (e.g., solder balls) may be attached to respective contact pads 135a, 115, and 135b. In one aspect, the conductive balls 140a, 145, and 140b may be the same type of conductive ball and are labeled differently for illustrative purposes. One exemplary conductive ball (e.g., 140a, 145 or 140b) may be approximately 0.65 mm to 0.75 mm in diameter (e.g., 0.635 mm). One exemplary contact pad 115 may be approximately 0.65 mm to 0.75 mm in diameter (e.g., 0.635 mm) or slightly larger than the diameter of its respective conductive ball.

The upper portion 182 of the package board 130, where the stripline 175 is disposed, may be considered a first impedance section in the ball grid array assembly 100. In one aspect, the stripline 175 may be configured to maintain a substantially constant impedance along its length. For example, the characteristic impedance associated with the signal line 174 and adjacent ground planes 170 and 180 may be maintained at approximately 50 ohms throughout the length of the signal line 174. The signal line 174 may be routed directly down to the contact pad 115 through the plated via structure 235 passing through the transition layers 110 within the upper portion 182 and within an underlying lower portion 186 of the package board 130. The upper portion 182 is sometimes referred to as a region 182. The lower portion 186 may be sometimes referred to as a region 186, a lower region, a compensation section, or a compensation region.

In one example, the upper portion 182 may include a region 183. The region 183 may include a portion of the via structure 235, a portion of the via structure 245, and optionally, one or more upper ground rings 225, where each of the ground rings may form a full ring or a partially-open ring. The characteristic impedance of the signal path in the region 183 may be also maintained at approximately 50 ohms. In one aspect, the via structure 245 in the region 183 may be disposed parallel to the via structure 235. The via structure 245 may include a plurality of vias arranged along one or more upper ground rings 225 around the via structure 235 and disposed vertically through the thickness of the transition layers 110 within the region 183. The via structure 245 may be disposed at a radial distance 127 from the via structure 235.

A lower portion 186 of the package board 130 may be considered a second impedance section. The lower portion 186 may include a via structure 235 and a ground structure including, for example, a ground interface plane 233, a via structure 247, contact pads 135a and 135b, and, optionally, one or more lower ground rings 230.

The portion of the via structure 235 surrounded by the via structure 247 in the lower portion 186 may be considered a transmission line. The impedance of the via structure 235 surrounded by the via structure 247 in the lower portion 186 at a frequency of 20 GHz may provide a characteristic impedance that is higher than of 50 ohms (e.g., 75 ohms). In order to match the characteristic impedance of the upper portion 182, according to an aspect of the subject technology, the structure of the conductive elements (e.g., elements 235, 233, 247, 230 and 115) and dielectric elements (e.g., transition layers 110) within the lower portion 186 are positioned in a certain configuration to compensate for the high impedance and produce an effective characteristic impedance of substantially 50 ohms at the desired high frequencies (e.g., between 20 and 40 GHz). In one example, a term "substantially 50 ohms" may be 50 ohms+/−5 ohms (or preferably 50 ohms+/−2 ohms, or more preferably 50 ohms+/−1 ohm). In one example, a term "about 50 ohms" may include similar ranges.

In one aspect, the via structure 247 in the lower portion 186 may be disposed parallel to the via structure 235. The via structure 247 may include a plurality of vias arranged along one or more lower ground rings 230 around the via structure 235 and disposed vertically through the thickness of the transition layers 110 within the portion 186. The via structure 247 may be disposed at a radial distance 126 from the via structure 235. The via structure 235 is connected to the contact pad 115. The via structure 247 is connected to the contact pads 135a and 135b.

In one aspect, the distance 126 is larger than the distance 127. In another aspect, the length 128 is larger than the distance between elements 170 and 174 (e.g., larger than the thickness of the dielectric layer between elements 170 and 174). In another aspect, the length 128 is larger than the distance between elements 180 and 174 (e.g., larger than the thickness of the dielectric layer between elements 180 and 174).

Figure 2B:
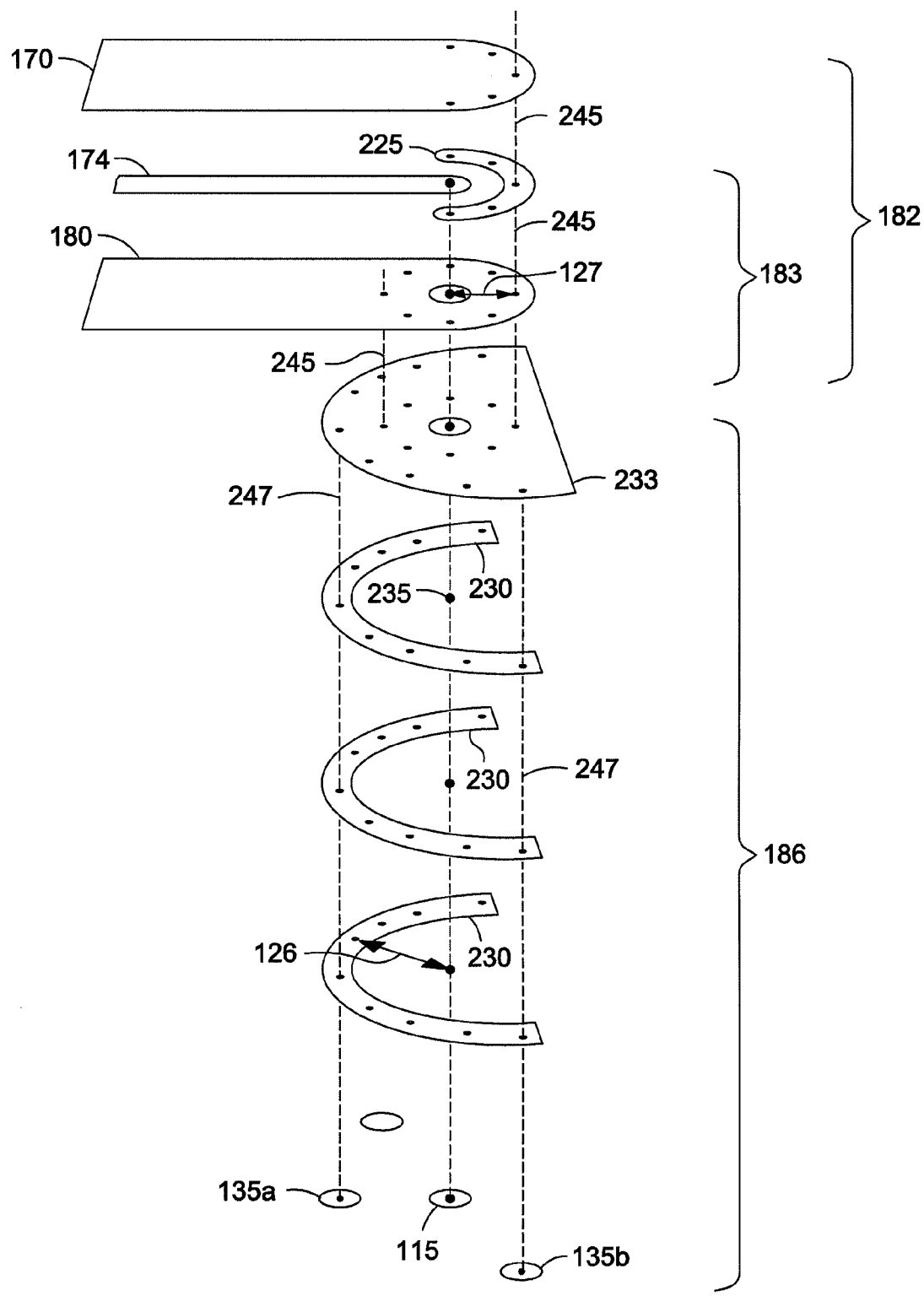
FIG. 2B is a perspective side view illustrating different conductive layers of a ball grid array assembly in accordance with an aspect of the subject technology.

Referring to FIGS. 2A and 2B concurrently, the coupling of the upper and lower ground planes 170 and 180 to contact pads (e.g., 135a and 135b) may occur by connecting the via structure 245 to the via structure 247 through a ground interface (e.g., a ground interface plane 233). The upper ground plane 170 may be coupled to a upper ground ring 225 through the via structure 245. The upper ground ring 225 may be coupled to the underlying lower ground plane 180 through the via structure 245. For the sake of illustration, only one upper ground ring 225 is shown, however, one or more upper ground rings 225 may be disposed between the upper ground plane 170 and the lower ground plane 180 and/or between the lower ground plane 180 and the ground interface plane 233.

In one aspect, the upper and lower ground planes 170 and 180 and the upper ground ring 225 are connected to the lower ground rings 230 using the ground interface plane 233. The ground interface plane 233 may be coupled to an underlying lower ground ring 230 through the via structure 247. One or more lower ground rings 230 may be employed between the ground interface plane 233 and the underlying ground contact pads (e.g., 135a and 135b) surrounding the contact pad 115.

In one aspect, the ground interface plane 233 may be formed on one of the transition layers where the via structure 245 may extend into and terminate at the ground interface plane 233, and the via structure 247 may start from the ground interface plane 233. The ground interface plane 233 may include a ground interface portion 120 overlapping a pad portion 122a of the contact pad 115. The ground interface portion 120 and the pad portion 122a may be the only conductive elements between each other. For example, non-conductive transition layers 110 may be disposed between the portions 120 and 122a, the portions 124 and 122a are the immediately adjacent conductive portions, and there are no other conductors directly between the portions 120 and 122a. The contact pad 115 may also include a pad portion 122b that may also be positioned to overlap with a ground interface portion 124 in a manner similar to the arrangement of the portions 120 and 122a.

Compensating for the impedance in the lower portion 186 (where the characteristic impedance may be greater than 50 ohms without utilizing an aspect of the subject technology) may be controlled by adjusting the position of various conductive components adjacent the via structure 235 within the portion 186. The effective characteristic impedance in the lower portion 186 may be dependent on the interaction among several neighboring conductive components. Some examples of neighboring components include the via structure 235, the via structure 247, some or all portions of the ground interface plane 233, the contact pad 115, and the lower ground rings 230 (if any). In one aspect, the above-mentioned neighboring components and the dielectric constant of the transition layer(s) within the region 186 may be the main contributors that affect the value of the characteristic impedance within the region 186.

The effective characteristic impedance of the lower portion 186 may be determined by the series combination of (i) the capacitance formed between contact pad 115 and ground interface plane 233 and (ii) the characteristic impedance and electrical length of the via structure 235 surrounded by the via structure 247 in the lower portion 186.

In one aspect of the disclosure, the size and shape of these components, the distance between these components and the dielectric constant of the dielectric material(s) have a significant effect on the characteristic impedance within the lower portion 186. Thus, in one aspect, the dimensions of these components and the distance among them (especially, the length 128, the distance 126, the size of the overlapping area 120/122a and 124/122b, and the diameter of a contact pad 115 in FIG. 2A) are critical to producing characteristic impedance within the lower portion 186 that matches with the characteristic impedance of the upper portion 182.

In one aspect of the disclosure, a multi-layer ceramic layout structure for a ball grid array (BGA) package in FIG. 2A is illustrated with standard ball size for improved signal integrity at a high data speed (e.g., greater than 20 Gbps). It is difficult to achieve good signal integrity with a BGA package with standard ball size (e.g., 0.635 mm) and standard ball-to-ball pitch (e.g., 1 mm). Contact pads (e.g., 115) on the package and the substrate 150 may be large, creating a large parasitic capacitance that severely degrades signal integrity above about 10 Gbps.

In one preferred example of the disclosure, standard ball-to-ball pitch and standard ball size are utilized (e.g., 1 mm and 0.635 mm respectively), the dielectric constant of a transition layer is 5.2, and the thickness of each of the transition layers is the same (e.g., 0.1 mm), and the ground interface plane 233 is disposed two or more transition layers above the contact pad 115 (or preferably four transition layers above the contact pad 115). In another example, a ground interface plane 233 may be disposed less than two transition layers 110 above the contact pad 115. The number of transition layers employed may depend on, among others, the thickness of the transition layers and the dielectric constant of the transition layers.

Figure 4:
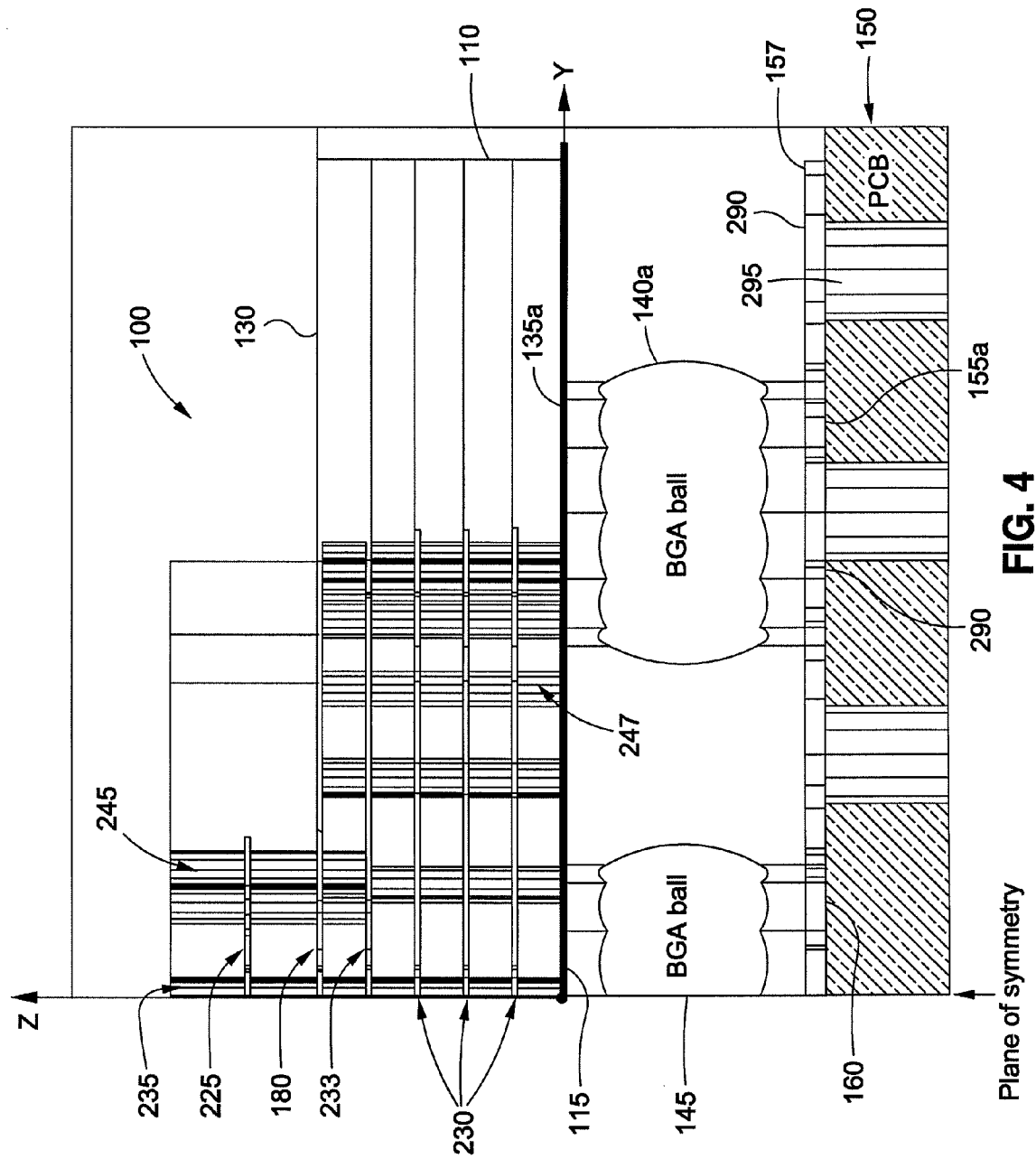
FIG. 4 is a cross-sectional end view illustrating different layers of a ball grid array package in accordance with an aspect of the subject technology.
Figure 5:
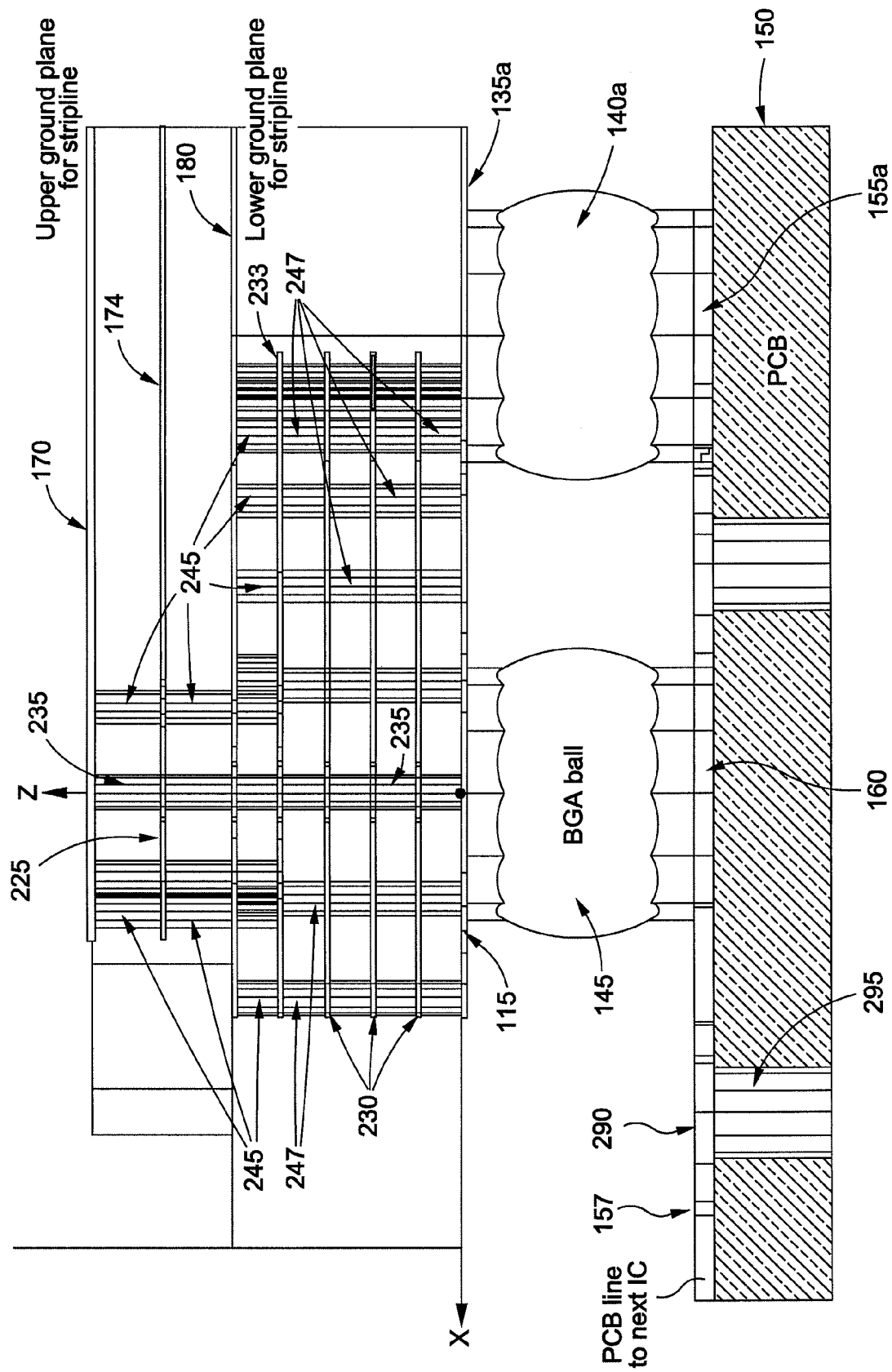
FIG. 5 is a cross-sectional side view illustrating different layers of the ball grid array package of FIG. 4.

Referring now to FIGS. 3A, 3B, 3C, 4 and 5, views showing an exemplary configuration of the ball grid array assembly 100 are shown as seen from above (FIGS. 3A, 3B and 3C), an end (FIG. 4), and a side (FIG. 5) of the ball grid array assembly 100. FIG. 3A is a top plan view illustrating different layers of a ball grid array assembly in accordance with an aspect of the subject technology. FIG. 3B is an enlarged view highlighting an exemplary ground interface plane. FIG. 3C is an enlarged view highlighting an exemplary upper ground ring. FIGS. 3A, 3B and 3C illustrate top plan views cut in half on XY-plane due to symmetry. FIGS. 4 and 5 illustrate an end view and a side view respectively of conductive components transitioning through the package board 130, conductive balls 140a, 140b and 145, and into an underlying substrate 150. FIGS. 4 and 5 illustrate cross-sectional views cut in half on XZ-plane due to symmetry.

Referring to FIGS. 1C, 2B, 3A, 4 and 5, the via structures 245 and 247 are illustrated around the via structure 235. A via structure 245 may be arranged along a semi-circular upper ground ring 225. An apex 226 of an upper ground ring is opposite an open portion of the ring. A via structure 245 may extend vertically to form a quasi-coaxial outer shell. A quasi-coaxial outer shell may be in a semi-coaxial or full-coaxial form. A quasi-coaxial outer shell may be formed by multiple vertical vias arranged in a semi-circular or full-circular shape. The vias are separated from each other by dielectric materials in the transition layers 110. More than one via structure 245 may be connected to the upper ground ring 225.

A via structure 247 may be arranged along a semi-circular lower ground ring 230 and may be connected to one or more lower ground rings 230. An apex 246 of each lower ground ring is opposite an open portion of its respective lower ground ring. More than one via structure 247 may be connected to the lower ground rings 230. The upper ground ring 225 may be oriented so that its apex 226 is pointing away from an apex 246 of its respective lower ground ring 230. A via structure 247 may extend vertically to form a quasi-coaxial outer shell. A quasi-coaxial outer shell may be in a semi-coaxial or full-coaxial form. A quasi-coaxial outer shell may be formed by multiple vertical vias arranged in a semi-circular or full-circular shape. The vias are separated from each other by dielectric materials in the transition layers 110.

Conductive balls 145, 140b, 140b', and 140a' are illustrated to provide an orientation of the relative positioning of conductive balls on their respective contact pads 115, 155b, 155b', and 155a'. While a conductive ball 140a is visible in FIGS. 4 and 5, it will be understood that it is out of view in FIG. 3A.

In one aspect, the ball grid array assembly 100 may also be connected to another system level. The ball grid array assembly 100 may be connected to a substrate 150 that includes one or more conductive traces 157 connected to substrate contact pads and to a plurality of plated vias 295 traversing through the substrate 150. In one aspect, the substrate 150 is a printed circuit board that may include other integrated circuit chip assemblies. A conductive trace 157 may include a plurality of conductive via pads 290 coupled to respective plated vias 295. A conductive trace 157 for signals may be coupled to substrate contact pads for signals (e.g., 160) and vias 295 for signals. A conductive trace 157 for ground may be coupled to substrate contact pads for ground (e.g., 155a, 155a', 155b, 155b') and vias 295 for ground and to a ground plane 151 (FIG. 2A). A conductive trace 157 may also be coupled to another packaged chip (not shown) or an electronic component (not shown) mounted on the substrate 150.

FIG. 3B illustrates a top plan view of a portion of a ground interface plane 233 (see the outline) disposed between an upper ground ring 225 and a lower ground ring 230. FIG. 3C illustrates an outline of a portion of a contact pad 115 disposed above the conductive ball 145 and below the lower ground ring 230.

Figure 6:
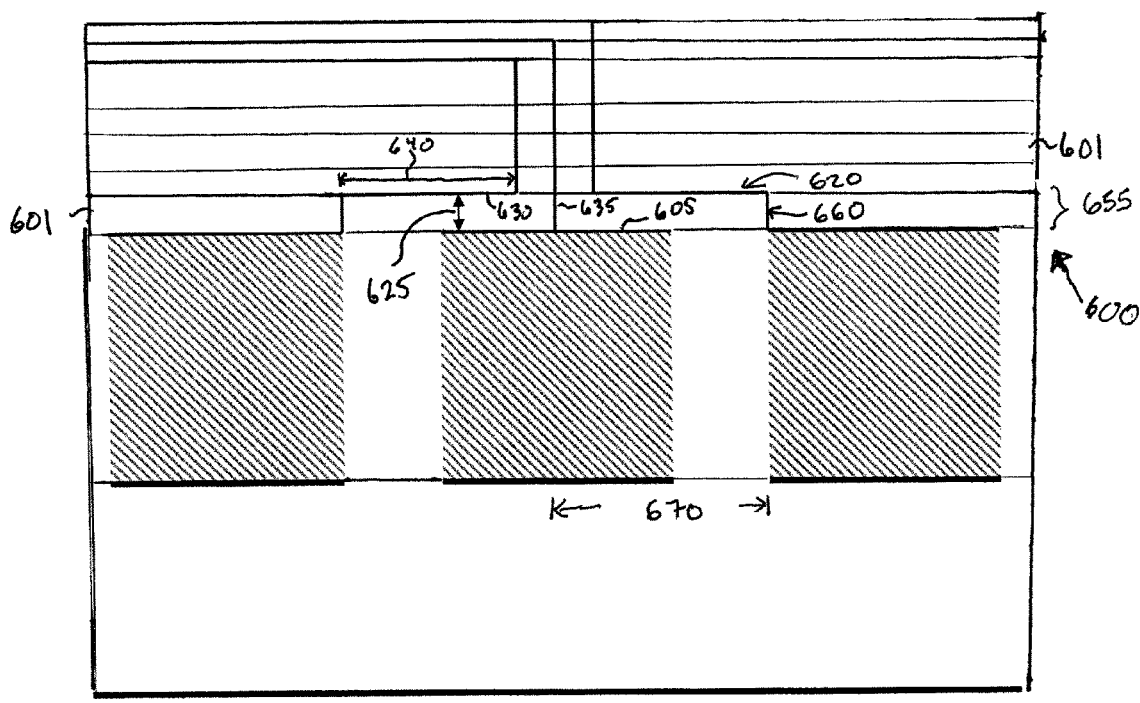
FIG. 6 is a cross-sectional view illustrating an example of a ball grid array assembly.

In one aspect, ball grid array assemblies may not be considered viable for applications employing relatively high frequencies, (e.g., 20 GHz or greater). For instance, as shown in FIG. 6, some ball grid array assemblies 600 may utilize a ground plane 620 that is one dielectric layer 601 away from a contact pad 605. A portion 630 may overlap a portion of the contact pad 605.

A relatively short physical length 625 with a relatively large contact pad 605 may produce an undesirably low effective characteristic impedance within the region 655. For example, the portion 630 may be separated from the contact pad 605 by a single dielectric layer 601 measuring approximately 0.10 mm thick. At a frequency of, for example, 20 GHz, the capacitance between the plane portion 630 and the contact pad 605 may be approximately 0.177 picofarads (pF). Additionally, a characteristic impedance for the via structure 635 with a surrounding ground via structure 660 having a radius 670 in the region 655 at a frequency of 20 GHz may be 75 ohms or higher with an electrical length of approximately 5.5 degrees at 20 GHz. The effective characteristic impedance of region 655, as calculated by the series combination of 0.177 pF to ground and transmission line with characteristic impedance of 75 ohms and electrical length of 5.5 degrees at 20 GHz, may be approximately 17 ohms with electrical length of 23 degrees at 20 GHz.

In one aspect, the positioning of conductive components employing aspects of the subject technology can significantly reduce capacitance between (i) a contact pad for a solder ball and (ii) a conductive element within a BGA assembly overlapping a portion of the contact pad. For example, referring back to FIG. 2A, a ball grid array assembly 100 can reduce the capacitance between a contact pad 115 and an overlying conductive element 233 overlapping a portion of the contact pad from 0.177 pF to 0.044 pF while the ball grid array assembly 100 is routing data at a frequency of 20 GHz. Additionally, the effective characteristic impedance within the region 186 (e.g., impedance contributed by elements 235, 115, 233 and 247 within the region 186) may be reduced to approximately 50 ohms, substantially matching the impedance in the overlying region 182 of the ball grid array assembly.

In one aspect, the foregoing described capacitance can be reduced by providing more transition layers 110 between a contact pad (e.g., 115) and an overlying conductive element (e.g., 233). The additional transition layers may not include conductive components between the overlapping conductive portions of elements. Providing additional transition layers between overlapping conductive portions may show an improvement in insertion loss and return loss for a device, thus demonstrating an improvement in signal integrity. However, as more transition layers are added, the length 128 of the via structure 235 within the lower region 186 will increase and thus increasing the inductance of the via structure 235. Accordingly, the number of transition layers or the length 128 needs to be adjusted appropriately to produce the proper inductance and capacitance for the region 186, thus producing characteristic impedance for the region 186 that matches with the characteristic impedance of the region 182.

A simulator such as the High Frequency Structure Simulator (HFSS) may be utilized to determine the proper dimensions and distance of the various components in the region 186 (e.g., the length 128 and the distance 126). In one aspect, it is advantageous and important to use standard ball size and standard ball-to-ball pitch so that an assembly is compatible with other standard assembly structure, and an assembly can be manufactured using standard equipment to reduce cost and manufacturing time. When the diameter of the conductive ball 145 and ball-to-ball pitch are standard sizes (thus the size and pitch of the contact pads are also standard sizes), the size of a contact pad 115 is predetermined to be (and fixed to) approximately the standard ball size (e.g., 0.635 mm), and the distance 126 is predetermined to be (and fixed to) approximately not greater than the standard ball-to-ball pitch size (e.g., less than 1 mm).

Referring to FIGS. 2A and 7A, a circuit representation 700 of a ball grid array package with a board (e.g., assembly 100 and substrate 150 in FIG. 2A) according to aspects of the subject technology is illustrated. Stripline 701 may represent a stripline 175 (e.g., elements 170, 174 and 180 in FIG. 2A) and a quasi-coaxial section of the upper portion 182 (e.g., a via structure 235 and ground elements 225 and 245 in the region 182). Section 710 may illustrate a transmission line representation of a quasi-coaxial section in the lower portion 186 of a ball grid array assembly (e.g., a via structure 235 and ground elements 233, 247 and 230 in the region 186). A port 705 may represent a connection point between the stripline 701 and the section 710. A capacitance between a contact pad for signals (e.g., 115) and the ground interface plane 233 within the ball grid array assembly may be represented by section 715.

In one aspect, the size of the contact pad 115 is such that the contact pad 115 together with the ground interface plane 233 contribute more than 30% of the total capacitance between the signal path and ground in the compensation region 186 between the ground interface plane and the contact pad 115. In a preferred embodiment, the size of the contact pad 115 is such that the contact pad 115 together with the ground interface plane 233 contribute about 50% (e.g., 50+/−5%) of the total capacitance between the signal path and ground in the compensation region 186. Without compensation, a contact pad (e.g., 605 in FIG. 6) together with a ground plane (e.g., 620) may contribute about 90%-95% of the total capacitance between the signal path and ground within a critical interface region (e.g., 655).

In one aspect, section 720 may illustrate a transmission line representation of conductive balls (e.g., conductive ball 145 in FIG. 2A). In another aspect, section 720 may represent a conductive ball 145, its substrate contact pad 160, and a portion of a conductive trace (e.g., 157 in FIGS. 3A and 4) coupled to the contact pad 160. At a frequency (F0) of 20 GHz, the characteristic impedance (Z0) of section 720 may be about 100 ohms, and the electrical length (EL, which is described in more detail below) may be 12 degrees. Section 725 may represent the capacitance between a substrate contact pad 160 and the ground (e.g., mainly a ground plane 151 in FIG. 2A). The capacitance of section 725 may be about 0.03 pF. In one aspect, sections 720 and 725 are not affected by whether a compensating aspect of the subject technology is implemented (e.g., adjusting the geometry such as sizes, shapes, dimensions and distance of the various elements within the region 186 in FIG. 2A).

Without implementing a compensating aspect of the subject technology within the region 186, at a frequency (F0) of 20 GHz, the characteristic impedance (Z0) of section 710 may be 75 ohms, and the electrical length (described below in more detail) of section 710 without compensation may be 5.5 degrees at 20 GHz. The capacitance of section 715 may be 0.177 pF without compensation.

If compensation is implemented within the region 186 according to one aspect of the disclosure (e.g., properly adjusting the geometry such as sizes, shapes, dimensions and distance of the conductive elements and non-conductive elements within the region 186), then at the frequency of 20 GHz, the characteristic impedance of section 710 together with section 715 may be substantially 50 ohms, the electrical length of section 710 may be 22 degrees, and the capacitance of section 715 may be about 0.044 pF. Thus, a ball grid array assembly in accordance with an aspect of the subject technology may exhibit improved performance at a frequency of 20 GHz. At 40 GHz, the electrical length (EL) may be approximately 44 degrees.

FIG. 7B illustrates an example of an insertion loss and a return loss of a ball grid array assembly employing an aspect of the subject technology. FIG. 7C illustrates an example of an insertion loss and a return loss of a ball grid array assembly that does not employ an aspect of the subject technology. The illustrations shown in FIGS. 7B and 7C are based on the simplified circuit representation depicted in FIG. 7A.

Figure 8A:
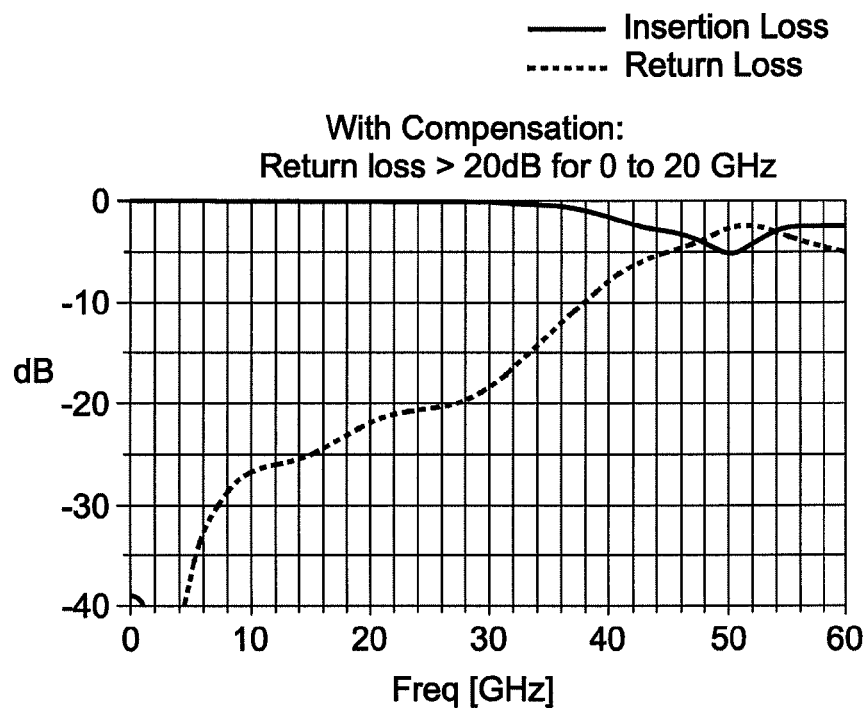
FIGS. 8A and 8B are exemplary plots illustrating a comparison of simulated frequency responses of a ball grid array package employing an aspect of the subject technology and a ball grid array package not employing the subject technology.
Figure 8B:
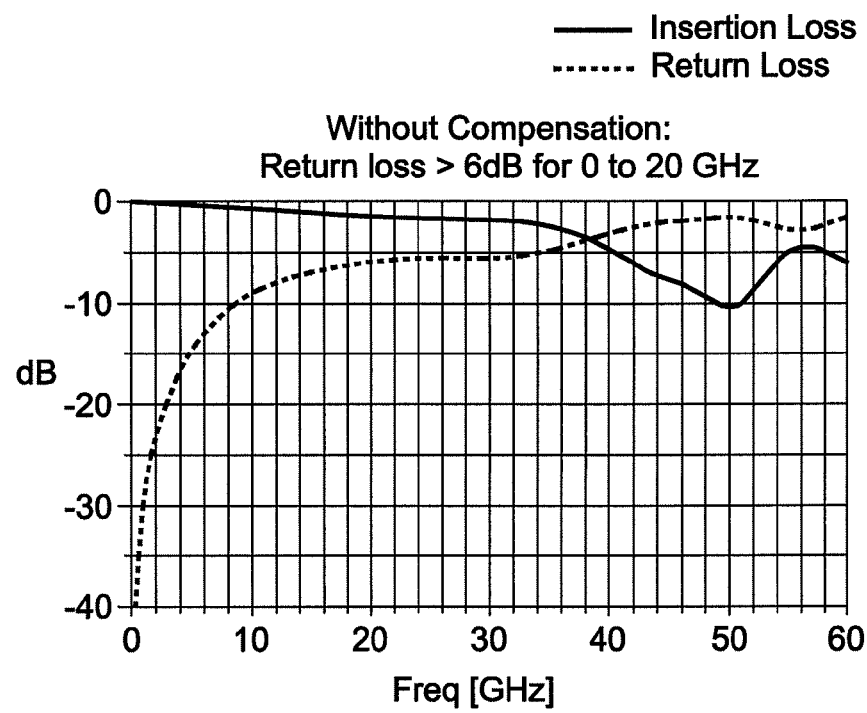

FIG. 8A illustrates a simulated frequency response of a ball grid array package employing an aspect of the subject technology. FIG. 8B illustrates a simulated frequency response of a ball grid array package that does not employ an aspect of the subject technology. FIG. 8A represents an example of the performance of a ball grid array package with a separation of overlapping conductive portions by, for example, four dielectric transition layers. As shown in FIG. 8A, when a ball grid array assembly employing an aspect of the subject technology is operated, an insertion loss between 0 and 20 GHz is nearly negligible while a return loss is better than 20 dB between 0 and 20 GHz. In comparison, in FIG. 8B, a ball grid array assembly that does not employ an aspect of the subject technology has a higher insertion loss between 0 and 20 GHz, and a return loss is worse than 6 dB between 0 and 20 GHz.

Figure 9A:
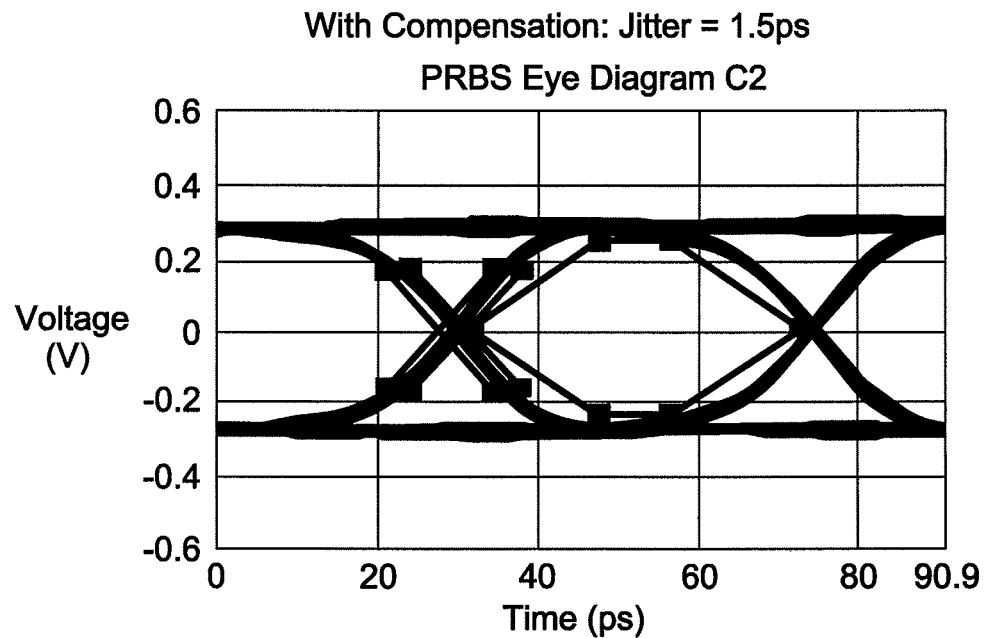
FIGS. 9A and 9B are exemplary eye diagram plots illustrating a comparison of a jitter for a ball grid array package employing an aspect of the subject technology and a ball grid array package not employing the subject technology.
Figure 9B:
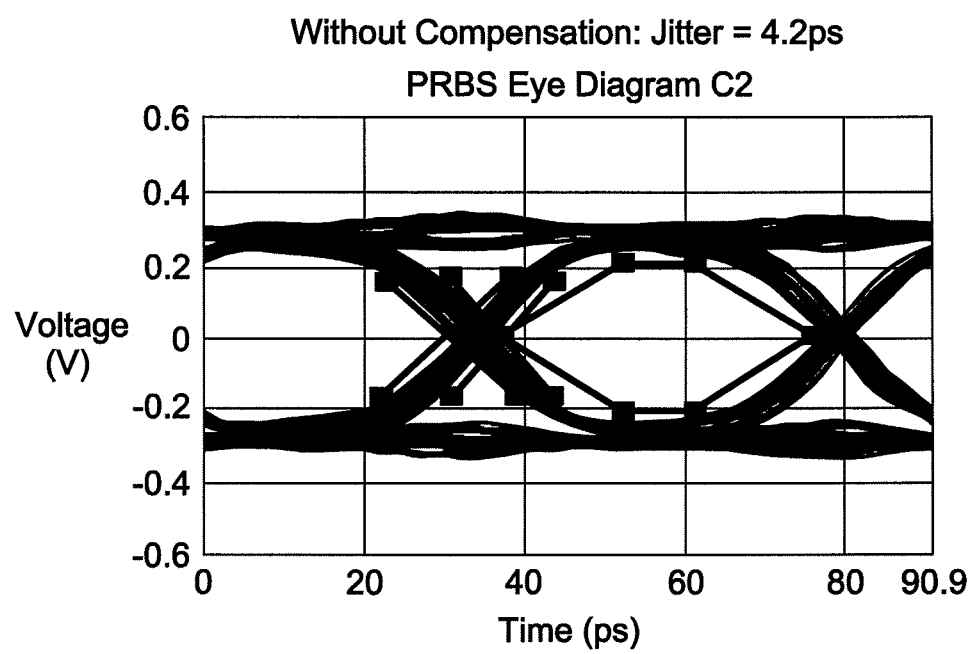

FIG. 9A illustrates a simulated performance of a ball grid array package employing an aspect of the subject technology in the form of eye diagrams depicting jitter during operation of a device. FIG. 9A illustrates that a ball grid array assembly employing an aspect of the subject technology can have a jitter of approximately 1.5 picoseconds. FIG. 9B illustrates a simulated performance of a ball grid array package that does not employ an aspect of the subject technology. A ball grid array assembly that does not employ a compensating aspect of the subject technology shows a jitter of approximately 4.2 picoseconds.

FIGS. 10 to 16 illustrate exemplary partial top plan views of various layers employed in a ball grid array assembly in accordance with aspects of the subject technology. The illustrated views show only a quadrant for each layer (a top-left quadrant of a BGA assembly such as a quadrant defined by X1-Y1 in FIG. 1B). It will be understood that the remaining quadrants for each layer may have symmetrical layouts or may have differing layouts.

Figure 10:
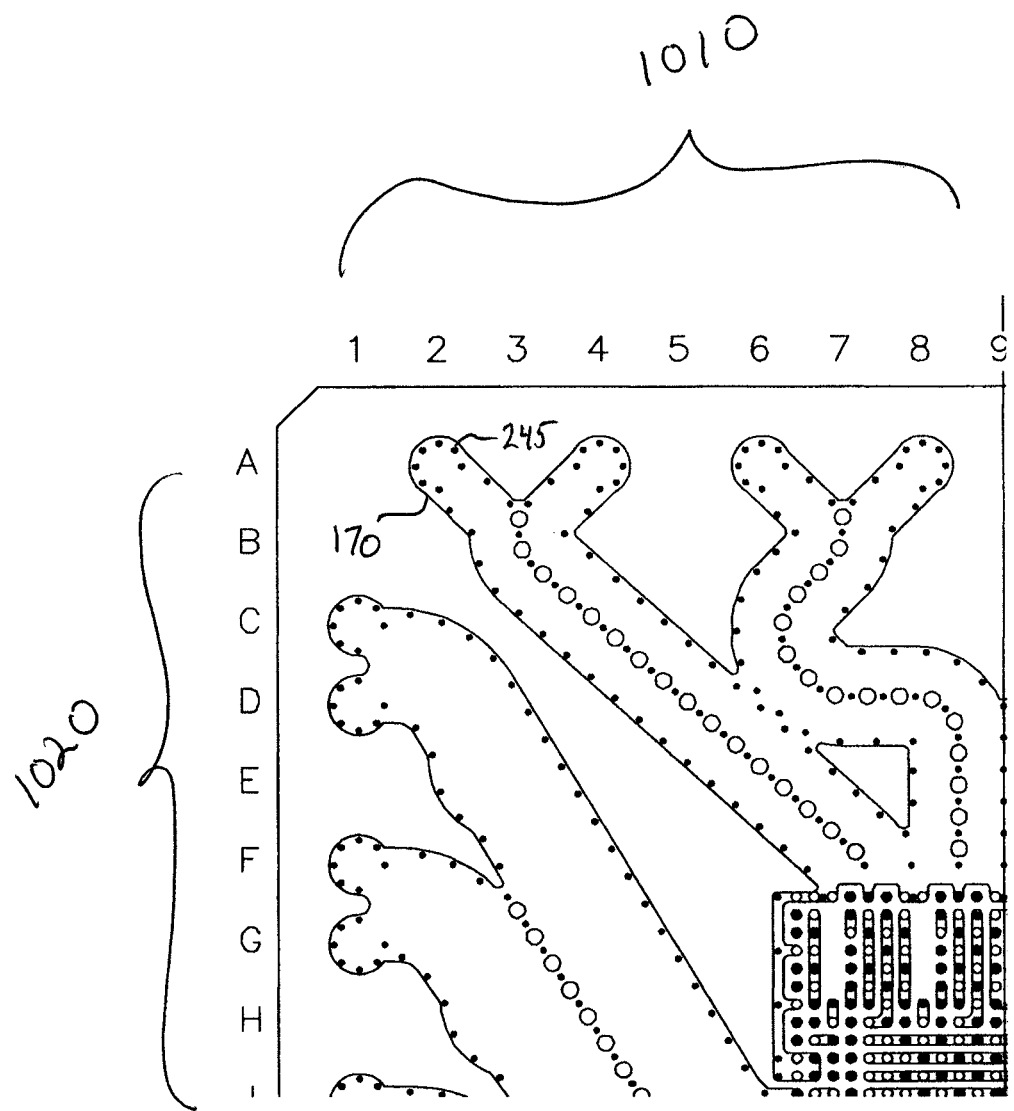
FIG. 10 is a partial top plan view illustrating an example of a layer including one or more upper ground planes in accordance with an aspect of the subject technology.

FIG. 10 illustrates an example of one or more upper ground planes 170 and via structures 245. A region 1010 identifies a high-speed (e.g., 20-40 GHz) area, and a region 1020 identifies a lower speed (e.g., 10 GHz or less) area.

Figure 11:
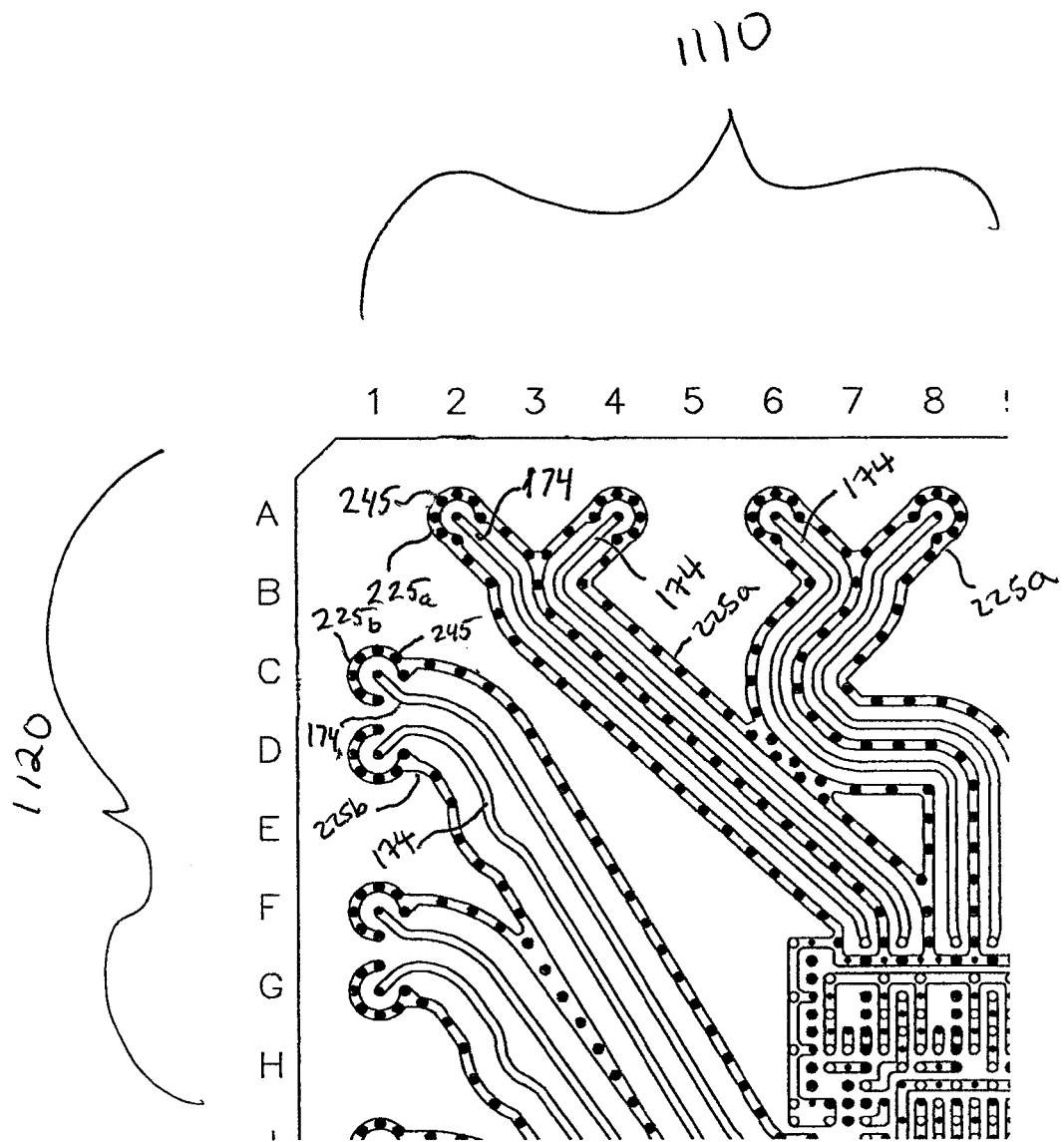
FIG. 11 is a partial top plan view illustrating an example of a layer including upper ground rings and signal lines in accordance with an aspect of the subject technology.

FIG. 11 illustrates an example of one or more signal lines 174, each surrounded by an upper ground ring (e.g., 225a, 225b). FIG. 11 also illustrates via structures 245 along upper ground rings. The upper ground rings may be either fully enclosed as illustrated by upper ground ring 225a or partially open as illustrated by upper ground ring 225b. In region 1110, the signal lines 174 may carry a differential pair of high-speed signals, such as a differential pair of 20 GHz signals. Region 1110 provides striplines in which each signal line 174 is fully surrounded (on all sides) by the ground ring 225a. In region 1120, the signal lines 174 may carry a differential pair of lower speed signals, such as a differential pair of 10 GHz signals. Region 1120 provides striplines in which a pair of signal lines 174 is surrounded by the shared ground ring 225b.

Figure 12:
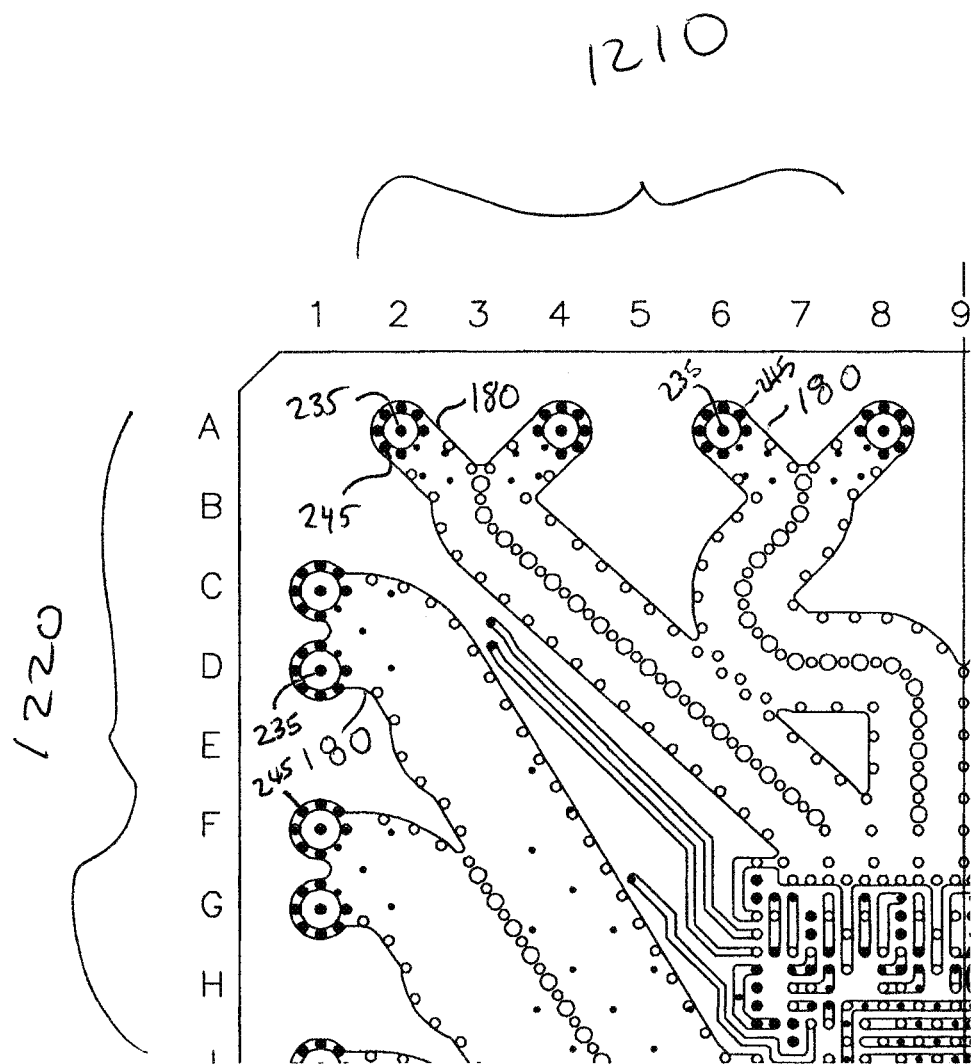
FIG. 12 is a partial top plan view illustrating an example of a layer including one or more lower ground planes in accordance with an aspect of the subject technology.

FIG. 12 illustrates an example of one or more lower ground planes 180 and via structures 235 and via structures 245. A region 1210 identifies a high-speed area, and a region 1220 identifies a lower speed area.

Figure 13:
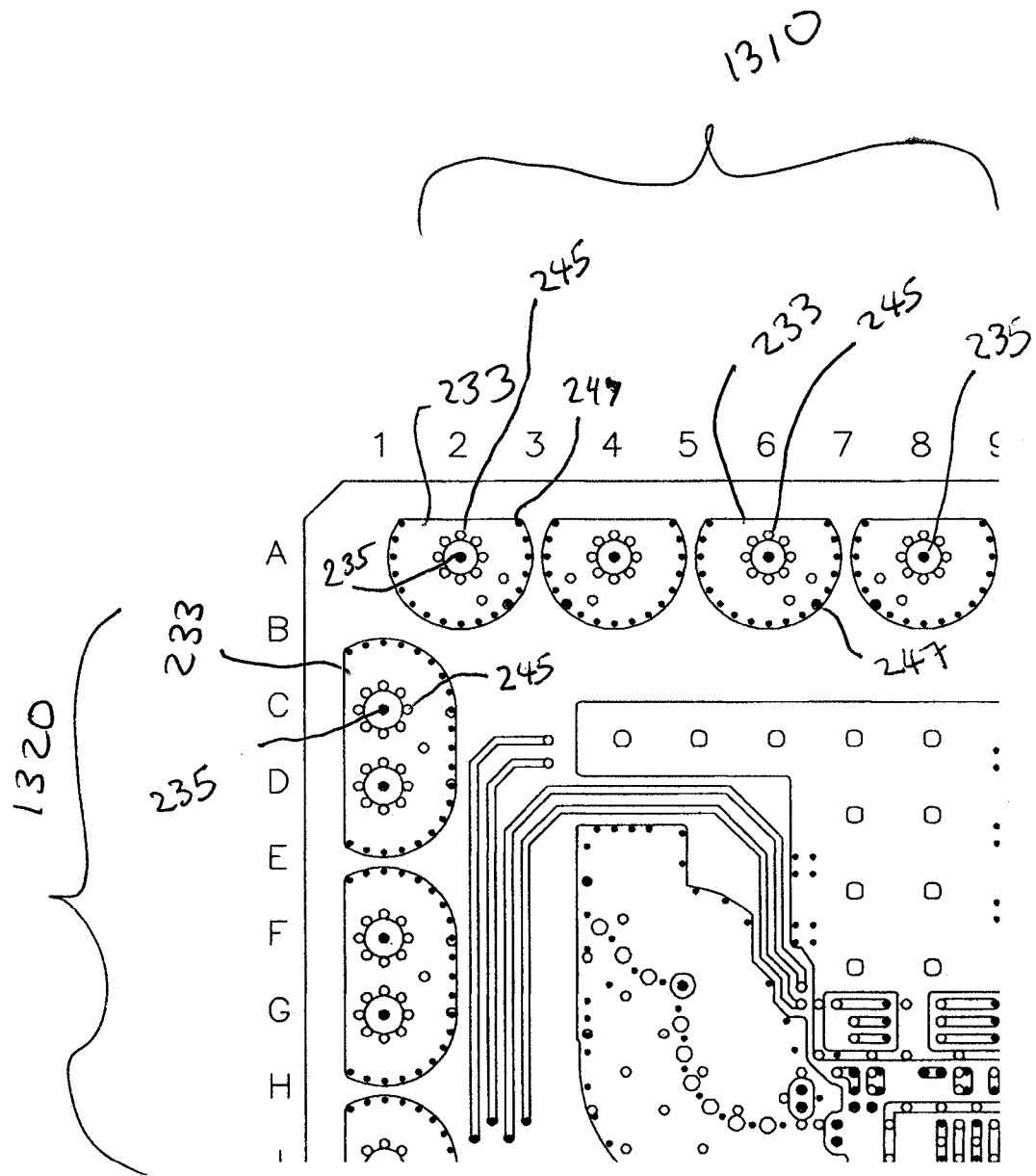
FIG. 13 is a partial top plan view illustrating an example of a layer including ground interface planes in accordance with an aspect of the subject technology.

FIG. 13 illustrates an example of one or more ground interface planes 233 including via structures 235, via structures 245, and via structures 247. The via structures 245 are connected to one or more ground interface planes 233 and are terminated at one or more ground interface planes 233. The via structures 247 are connected to one or more ground interface planes 233 and extend vertically down starting from one or more ground interface planes 233. In region 1310, the via structures 235 carry high-speed signals (e.g., 20 GHz signals). In region 1320, the via structures 235 carry lower speed signals (e.g., 10 GHz signals). The ground interface planes 233 have a partially circular shape (in region 1310) and a partially oval shape (in region 1320) because they are located close to the edge of the BGA assembly. However, in another example, the shape of the ground interface planes may be of a fully circular shape, a fully oval shape or another shape.

Figure 14:
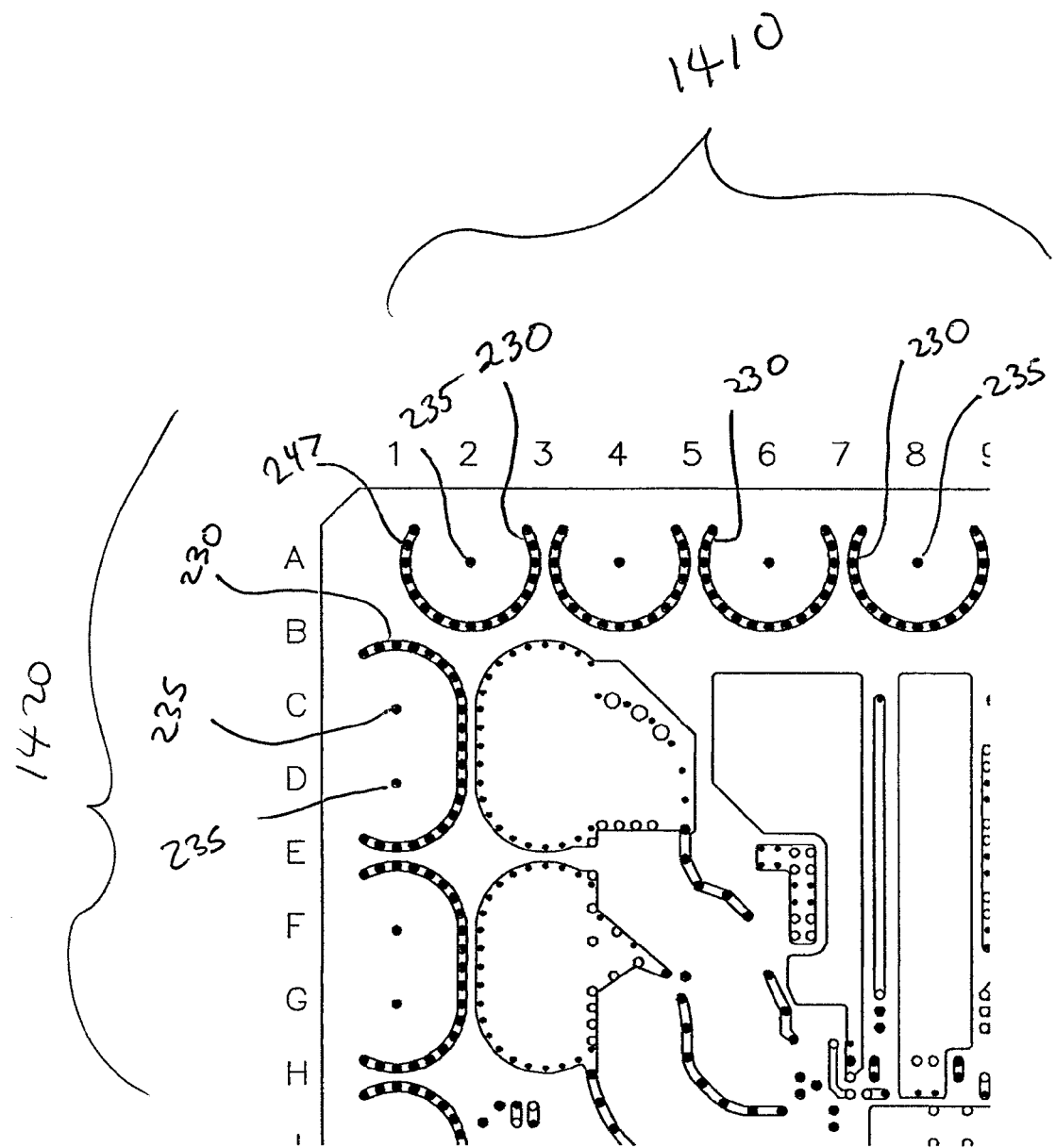
FIG. 14 is a partial top plan view illustrating an example of a layer including lower ground rings in accordance with an aspect of the subject technology.

FIG. 14 illustrates an example of one or more lower ground rings 230 and via structures 247 along the rings. In a high-speed region 1410, each lower ground ring 230 surrounds its respective via structure 235. In a lower speed region 1420, a lower ground ring 230 may surround two via structures 235. A BGA assembly may include one or more layers similar to the layer shown in FIG. 14, as illustrated in FIG. 2B. Like the shape of a ground interface plane, the shape of a lower ground ring may be a partial ring, a full ring or another shape.

Figure 15:
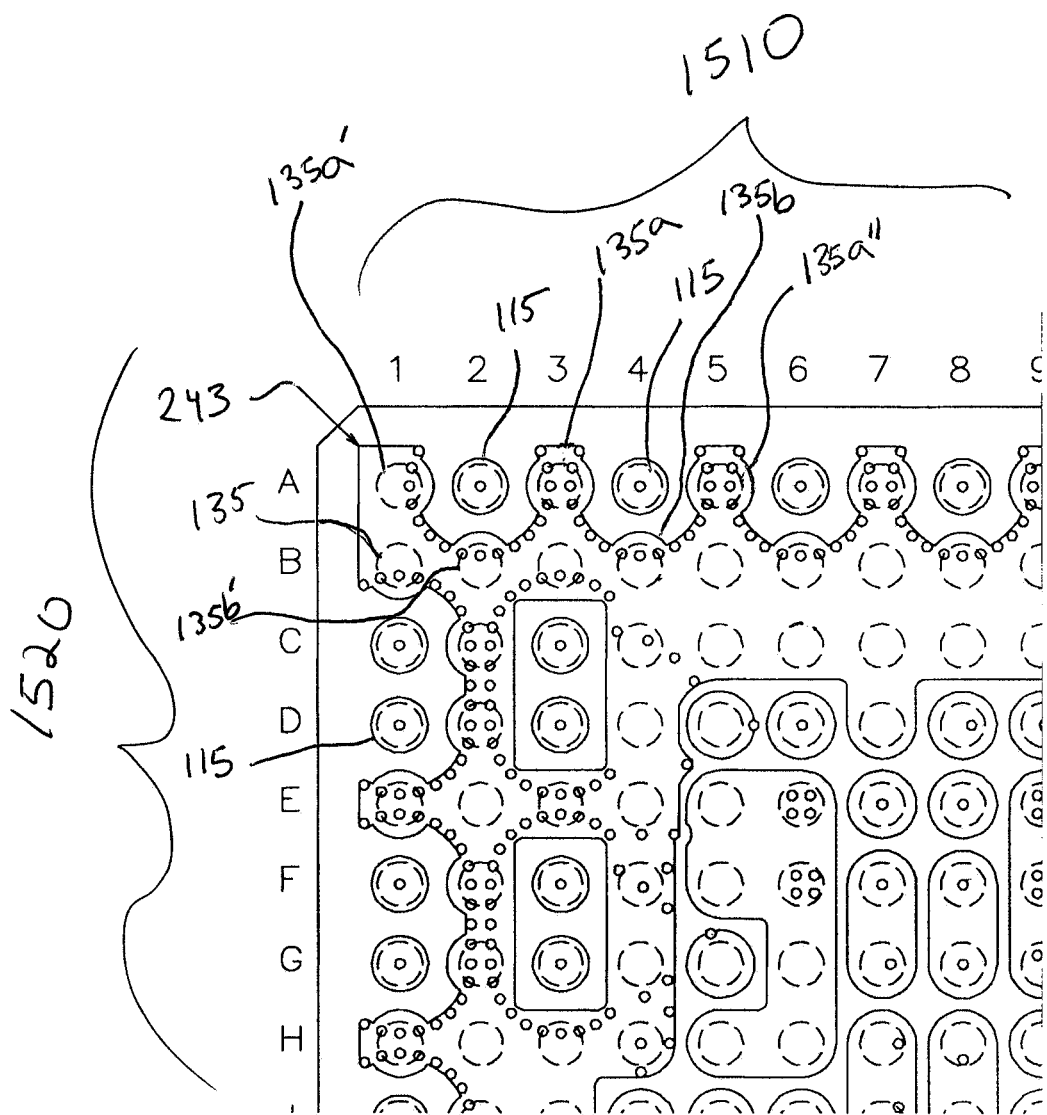
FIG. 15 is a partial top plan view illustrating an example of contact pads in accordance with an aspect of the subject technology.

FIG. 15 illustrates a plurality of contact pads 115 for carrying signals and a plurality of ground contact pads (e.g., 135a, 135b, 135a', 135b', 135a", 135). The ground contact pads are portions of a large piece of a ground plane 243. In region 1510, the contact pads 115 are for carrying high-speed signals, and in region 1520, the contact pads 115 are for carrying lower speed signals.

Figure 16:
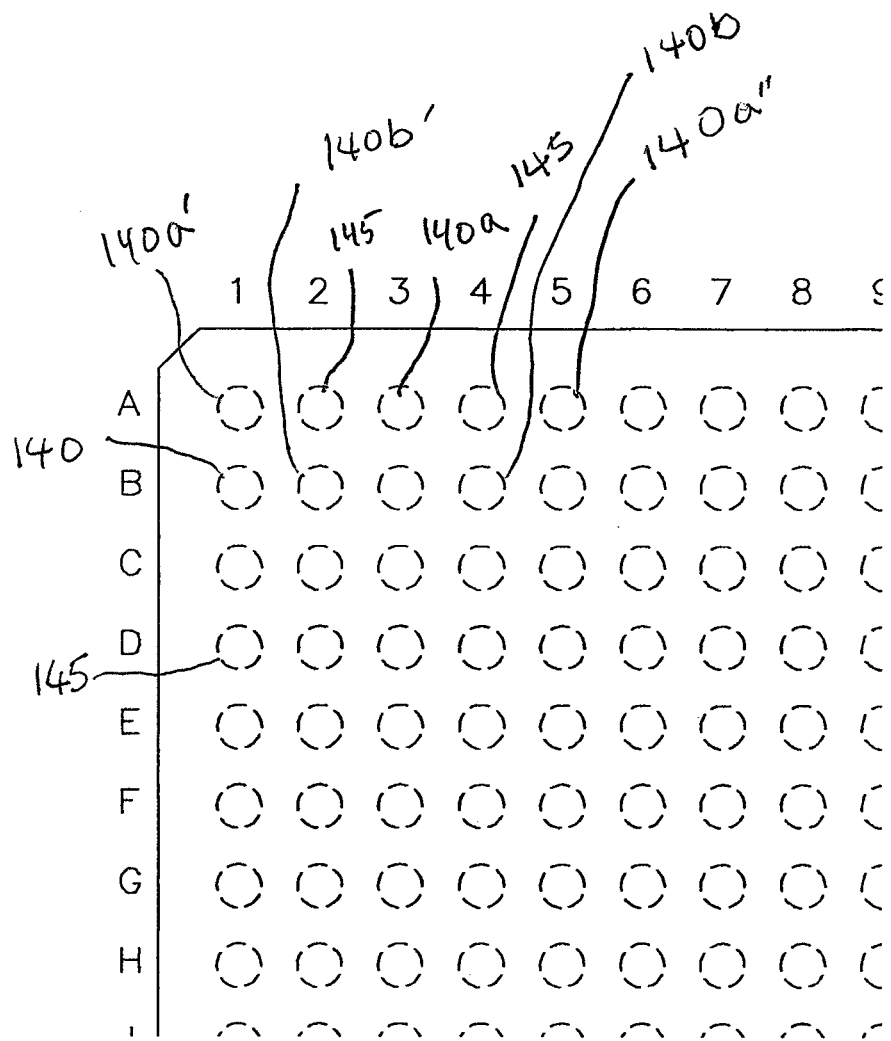
FIG. 16 is a partial top plan view illustrating an example of conductive balls in accordance with an aspect of the subject technology.
Figure 17:
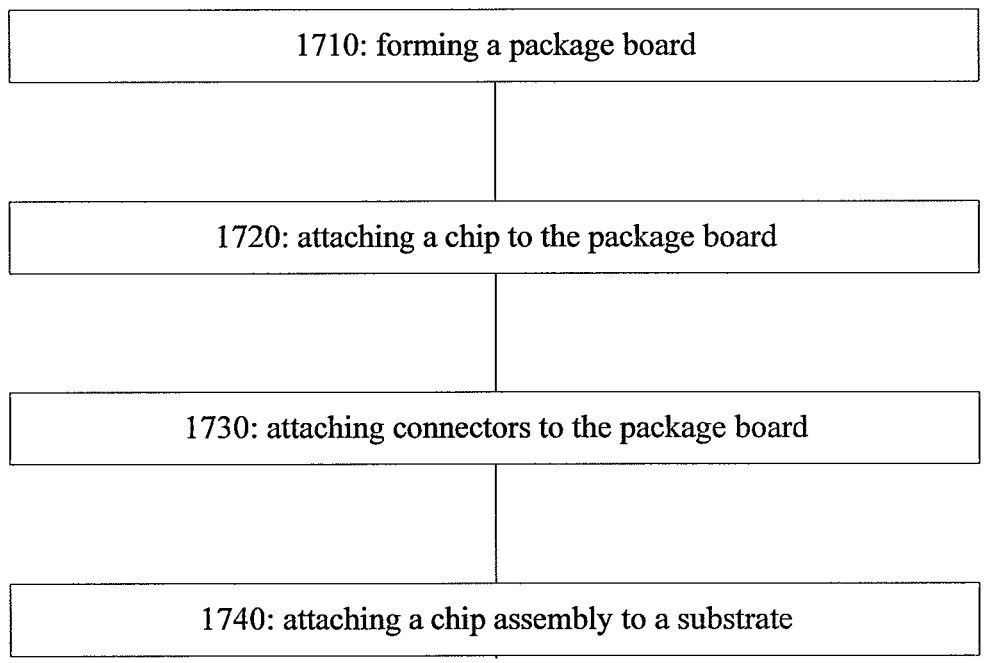
FIG. 17 illustrates a method of fabricating a ball grid array package according to one aspect of the disclosure.

FIG. 16 illustrates conductive balls 145 for carrying signals and conductive balls for ground (e.g., 140a, 140b, 140a', 140b', 140a", 140).

Those of skill in the art would appreciate that various components and blocks may be arranged differently (e.g., arranged in a different order, or partitioned in a different way) all without departing from the scope of the subject technology. Specific numerical examples are provided for illustration purposes, and other numerical examples may be possible.

Now referring to FIGS. 2A, 2B and 10-16, while various components can contribute to the characteristic impedance in the region 186, in one aspect, the primary factors are (i) the geometry such as the size, shape and distance of the components within the region 186 (e.g., the pad size of a contact pad 115, the length 128 of the via structure 235, the radius 126, the overlapping area between elements 233 and 115) and (ii) the dielectric constant of a transition layer 110. A simulator such as the High Frequency Structure Simulator (HFSS) may be utilized to take into account all of the primary factors mentioned above as well as secondary factors such as the inductance and capacitance contributed by the conductive balls (e.g., 145), substrate contact pads (e.g., 160), conductive traces on the substrate 150, and/or the ground plane 151.

In one aspect, the length 128 may be determined as a function of, among others, the pad size of a contact pad (e.g., 115), the dielectric constant ($\in_r$) of a transition layer (e.g., 110), and the distance between the signal path and the ground (e.g., radius 126). In one example, the dielectric constant ($\in_r$) is 5.2. Depending on the material of the transition layer, the dielectric constant ($\in_r$) may be a value between 2 and 10.

In one aspect, an electrical length (EL) may be determined by and expressed as:

$$EL = F * G * (L/c) * (\sqrt{\in_r})  \quad \text{equation (1)},$$

where F is the frequency of a signal being routed through a BGA assembly (e.g., the frequency of the signal being carried by a via structure 235, such as 20 GHz), G is 360 degrees, L is the length of the signal path within a compensation region such as the region 186 (e.g., the length 128), $\in_r$ is the dielectric constant of a transition layer within the compensation region, and c is the speed of light. Thus, an electrical length may be expressed in degrees.

In one aspect, it is important to have an electrical length that is less than 45 degrees. A capacitance between the ground interface plane 233 and the contact pad 115 of FIG. 2A may be dependent on establishing an electrical length that is less than 45 degrees. In one configuration of the subject technology, the electrical length is 22 degrees for a frequency of 20 GHz, the electrical length is 36 degrees for a frequency of 33 GHz and the electrical length is 44 degrees for a frequency of 40 GHz.

In one aspect, it is important to have the length of the signal path within the compensation region such as the region 186 (e.g., the length 128) to be less than ⅛ of the wavelength of the signal or, preferably, less than 1/16 of the wavelength of the signal. The wavelength of a signal is $c/(\sqrt{\in_r} * F)$, where c is the speed of light, $\in_r$ is the dielectric constant of a transition layer within the compensation region, and F is the frequency of the signal.

When $\in_r$ is 5.2, and the signal frequency is 20 GHz, it may be important to have the length 128 to be less than 0.8 mm or, preferably, less than or equal to 0.4 mm, and these values correspond to EL of 44 degrees and 22 degrees, respectively. When $\in_r$ is 5.2, and the signal frequency is 40 GHz, it may be advantageous to have the length 128 to be less than 0.4 mm or, preferably, less than or equal to 0.2 mm, and these values correspond to EL of 44 degrees and 22 degrees, respectively.

For a different frequency or for different $\in_r$, the length (L) can be scaled according to the following formula:

$$L = EL/(F*G) * c/(\sqrt{\in_r}) \quad \text{equation (2)},$$

where the terms in equation (2) are previously described above in relation with equation (1). Some examples of various $\in_r$, frequencies, EL and L are presented in Table 1 below.

TABLE 1

| $\in_r$ | F (GHz) | G (degrees) | C (m/sec) | EL (degrees) | L (mm) |
|---|---|---|---|---|---|
| 5.2 | 20 | 360 | 299,792,458 | 22 | 0.40 |
| 5.2 | 20 | 360 | 299,792,458 | 44 | 0.80 |
| 5.2 | 40 | 360 | 299,792,458 | 22 | 0.20 |
| 5.2 | 40 | 360 | 299,792,458 | 44 | 0.40 |
| 3 | 20 | 360 | 299,792,458 | 22 | 0.53 |
| 3 | 20 | 360 | 299,792,458 | 44 | 1.06 |
| 3 | 40 | 360 | 299,792,458 | 22 | 0.26 |
| 3 | 40 | 360 | 299,792,458 | 44 | 0.53 |
| 5.2 | 33 | 360 | 299,792,458 | 36 | 0.40 |
| 3 | 33 | 360 | 299,792,458 | 36 | 0.52 |

In one preferred embodiment, the frequency of a signal is less than 40 GHz (e.g., less than or equal to 33 GHz) and greater than or equal to 20 GHz.

In one aspect, the ball-to-ball pitch may be between 1.5 mm and 0.5 mm, and the respective ball size may be between 1 and 0.3 mm. Some examples of various ball-to-ball pitch and ball size combinations that may be utilized are shown in Table 2 below.

TABLE 2

| ball-to-ball pitch | ball size | Standard/non-standard |
|---|---|---|
| 1.5 mm | 1 mm | |
| 1.25 mm | 0.8 mm | |
| 1 mm | 0.635 mm | Standard size |
| 0.8 mm | 0.5 mm | Standard size |
| 0.65 mm | 0.4 mm | Non-standard size |
| 0.5 mm | 0.3 mm | Non-standard size |

The ball-to-ball pitch and ball size may be dictated by the system requirement or the application requirement. For the sizes mentioned above, a conventional BGA assembly has not been able to provide 50 ohm characteristic impedance in the signal path region (e.g., the region 186) immediately adjacent to the BGA contact pads for high frequency signals (e.g., 20 GHz-40 GHz signals). An aspect of the disclosure provides a compensation region (e.g., 186) in which the geometry of the various conductive and non-conductive elements is properly determined to provide the 50-ohm characteristic impedance, as described above. When the ball-to-ball pitch and ball size are constrained, then the distance between the signal path and the ground (e.g., radius 126) cannot be varied much, and mostly the length of the signal path (e.g., the length 128) is varied to produce the 50-ohm characteristic impedance in the compensation region 186.

While referring to FIGS. 1A, 2A, 2B and 5, a method of fabricating a ball grid array package is described below according to one aspect of the disclosure. At operation 1710, a package board (e.g., 130) may be formed. A package board 130 may include one or more via structures (e.g., 235, 245 and/or 247), one or more ground planes (e.g., 170 and/or 180), one or more ground interface planes (e.g., 233), one or more ground rings (e.g., 225 and/or 230), and/or one or more contact pads (e.g., 115, 135*a* and/or 135*b*).

At operation 1720, a chip (e.g., a component such as an integrated circuit die) may be attached to the package board. A chip may be an electronic, optical, or an opto-electronic component. A chip may be, for example, a silicon die chip 299. A method of attaching a chip to the package board may utilize solder balls 298 (e.g., for a flip chip), wire bonds or other methods. An underfill 297 may also be formed around the solder balls 298. Operation 1720 may also include encapsulating the chip using, for example, a molding compound (not shown) to surround the top and sides of the chip and the solder balls.

At operation 1730, connectors such as conductive balls (e.g., 145, 140*a*, 140*b*) may be attached to the bottom of the package board. At operation 1740, a chip assembly, which includes the chip, the package board, and the connectors, may be attached to a substrate (e.g., 150). Prior to operation 1740, the substrate may have been formed with conductive elements and non-conductive elements such as contact pads (e.g., 160, 155*a* and/or 155*b*), conductive traces (e.g., 157), vias (e.g., 295), and ground planes (e.g., 151).

In one aspect, operation 1710 may comprise: (i) forming one or more lower transition layers (e.g., 110 in the region 186), (ii) forming one or more first-type via structures (e.g., 235 for signals) in the one or more lower transition layers, and (iii) forming one or more second-type via structures (e.g., 247 for ground) in the one or more lower transition layers. Operation 1710 may also comprise forming one or more lower ground rings (e.g., 247). Operation 1710 may further comprise forming one or more ground interface planes (e.g., 233).

Operation 1710 may further comprise forming one or more intermediate transition layers (e.g., 110 in the region 183) and forming one or more first-type via structures (e.g., 235 for signals) and one or more second-type via structures (e.g., 245 for ground).

Operation 1710 may further comprise forming one or more upper transition layers (e.g., 110 in the region 182 above the region 183), forming one or more ground planes (e.g., 170 and/or 180), and forming one or more signal lines. Operation 1710 may further comprise forming one or more first-type via structures (e.g., in the region 182 above the region 183). Operation 1710 may further comprise forming one or more second-type via structures (e.g., 245). Operation 1710 may further comprise forming one or more upper ground rings (e.g., 225 in the region 182 above the region 183).

Operation 1710 may further comprise forming one or more contact pads (e.g., 115, 135*a* and/or 135*b*).

The operations described above may be performed in different orders, some of the operations may be performed simultaneously, and some of the operations or steps may be divided into further operations or steps. Via structures may be formed on one transition layer at a time or formed on multiple transition layers in one operation.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects.

In one example, a semi-circular shape may be a partially circular shape. In another example, a semi-circular shape may be a fully circular shape. A circular shape may be a shape that has a curvature. A circular shape may be an irregular shape. In one example, a quasi-coaxial configuration may be any coaxial configuration. In one example, a ring may have a circular shape. In another example, a ring may have a non-circular shape. In another example, a ring may be fully circular. In another example, a ring may be partially circular. In another example, a ring may be fully enclosed. In another example, a ring may be partially enclosed. In one example, a ring may have an aperture or an opening in an inter portion. A ring may be for an upper or lower ground ring.

Referring to FIGS. 2B and 13, a ground interface plane 233 associated with a via structure 235 may be one piece (as shown). In another example, a ground interface plane 233 associated with a via structure 235 may be multiple pieces, where one of the pieces is connected to an upper ground plane 170, and another one of the pieces is connected to a lower ground plane 180.

It is understood that the specific order or hierarchy of operations in the processes disclosed is an illustration of exemplary approaches. Based upon design preferences, it is understood that the specific order or hierarchy of operations in the processes may be rearranged. The accompanying method claims present elements of various operations, and are not meant to present a specific order or hierarchy. An operation may be performed in multiple sub-operations (e.g., forming a plurality of transition layers may be performed by forming a first transition layer in one operation and forming a second dielectric layer in another operation either sequentially or after one or more other operations, e.g., forming a via structure). Some of the operations may be performed simultaneously. Operations and sub-operations may be performed in orders different from the orders presented.

The claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

Terms such as "top," "bottom," "front," "rear," "above," "below" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference. Similarly, an item disposed above another item may be located above or below the other item along a vertical, horizontal or diagonal direction; and an item disposed below another item may be located below or above the other item along a vertical, horizontal or diagonal direction.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such an embodiment may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. An integrated circuit chip package, comprising:
an integrated circuit chip;
a package board, wherein the integrated circuit chip is mounted onto a top surface of the package board, wherein the package board is configured to send or receive a signal at a frequency greater than 10 GHz, the package board comprising:
  a first impedance section configured to provide a first characteristic impedance, the first impedance section disposed in an upper portion of the package board, the first impedance section comprising:
    a signal line;
    one or more ground planes disposed vertically adjacent to the signal line;
    one or more transition layers that are dielectric, the one or more transition layers disposed among the signal line and the one or more ground planes;
    first one or more signal vias coupled to the signal line; and
    a first set of first ground vias disposed parallel to the first one or more signal vias at a first radius from the first one or more signal vias, the first set of first ground vias being disposed in one or more transition layers in the upper portion of the package board, the first set of first ground vias coupled to at least one of the one or more ground planes; and
  a second impedance section configured to provide a second characteristic impedance, the second impedance section disposed in a lower portion of the package board, the second impedance section comprising:
    a ground interface plane;
    second one or more signal vias vertically coupled to the first one or more signal vias;
    one or more transition layers that are dielectric;
    a first set of second ground vias disposed parallel to the second one or more signal vias at a second radius from the second one or more signal vias, the first set of second ground vias being disposed in one or more transition layers in the lower portion of the package board; and
    a plurality of contact pads disposed on a bottom surface of the package board, the plurality of contact pads being conductive, the plurality of contact pads comprising a signal contact pad and ground contact pads;
    wherein the ground interface plane is disposed between the first set of first ground vias and the first set of second ground vias and is coupled to the first set of first ground vias and to the first set of second ground vias,
    wherein the second one or more signal vias are connected to the signal contact pad,
    wherein the first set of second ground vias is connected to the ground contact pads; and
  a plurality of conductive balls, each of the plurality of conductive balls directly connected to a respective one of the plurality of contact pads;
wherein a position of the first set of second ground vias relative to a position of the second one or more signal vias and a position of the signal contact pad relative to a position of the ground interface plane are configured to provide the second characteristic impedance that substantially matches the first characteristic impedance at a signal frequency greater than 10 GHz.

2. The integrated circuit chip package of claim 1, wherein the first and second characteristic impedances are approximately between 45 ohms and 55 ohms.

3. The integrated circuit chip package of claim 1, wherein the first set of first ground vias are disposed in a quasi-coaxial arrangement around the first one or more signal vias, and
    wherein the first set of second ground vias are disposed in a quasi-coaxial arrangement around the second one or more signal vias.

4. The integrated circuit chip package of claim 1, wherein a portion of the ground interface plane is disposed to overlap a portion of the signal contact pad,
    wherein the portion of the ground interface plane and the portion of the signal contact pad that overlap are immediately adjacent conductive portions, and
    wherein the portion of the ground interface plane and the portion of the signal contact pad are separated by two or more transition layers.

5. The integrated circuit chip package of claim 1, wherein the integrated circuit chip is coupled to the package board in a flip-chip configuration, and
    wherein the signal frequency is greater than or equal to 20 GHz and less than 40 GHz.

6. The integrated circuit chip package of claim 1, further comprising:
    one or more upper ground rings disposed around or about one or more vias of the first one or more signal vias in the upper portion of the package board, the one or more upper ground rings coupled to one or more vias of the first set of first ground vias and to the ground interface plane, the one or more upper ground rings disposed vertically above the ground interface plane; and
    one or more lower ground rings disposed around or about one or more vias of the second one or more signal vias in the lower portion of the package board, the one or more lower ground rings coupled to one of more vias of the first set of second ground vias and to the ground interface plane, the one or more lower ground rings disposed vertically below the ground interface plane and above the plurality of contact pads.

7. The integrated circuit chip package of claim 6, wherein an apex of the one or more upper ground rings is disposed in an opposite position of an open end of the one or more upper ground rings,
    wherein an apex of the one or more lower ground rings is disposed in an opposite position of an open end of the one or more lower ground rings, and
    wherein the apex of the one or more upper ground rings is disposed in an opposite position of the apex of the one or more lower ground rings.

8. The integrated circuit chip package of claim 1, wherein the distance of separation between the ground interface plane and the signal contact pad is at least a thickness of two transition layers in the upper portion of the package board,
    wherein one or more vias of the first set of first ground vias are arranged around one or more first semi-circular contours,
    wherein one or more vias of the first set of second ground vias are arranged around one or more second semi-circular contours,
    wherein a diameter of the one or more second semi-circular contours is greater than a diameter of the one or more first semi-circular contours.

9. The integrated circuit chip package of claim 1,
    wherein each of the one or more transition layers in the upper portion of the package board has a same thickness,
    wherein each of the one or more transition layers in the lower portion of the package board has a same thickness,
    wherein the ground interface plane and the signal contact pad are separated by two or more transition layers in the lower portion of the package board.

10. The integrated circuit chip package of claim 1, further comprising:
    wherein the ground interface plane has an aperture,
    wherein the size of the signal contact pad is such that the signal contact pad and the ground interface plane contribute approximately 50% of a total capacitance between a signal path and ground in a region between the ground interface plane and the signal contact pad,
    wherein a length of the second one or more signal vias disposed between the ground interface plane and the signal contact pad is the distance of separation between the ground interface plane and the signal contact pad.

11. The integrated circuit chip package of claim 1,
    wherein the one or more ground planes comprise:
        an upper ground plane disposed above the signal line within the upper portion of the package board;
        a lower ground plane disposed below the signal line within the upper portion of the package board;
    wherein the integrated circuit chip package comprises:
        a bottom ground plane disposed on the bottom surface of the package board;
        one or more upper ground rings disposed around or about one or more vias of the first one or more signal vias in the upper portion of the package board, the one or more upper ground rings coupled to one or more vias of the first set of first ground vias and to the ground interface plane, the one or more upper ground rings disposed vertically above the ground interface plane
        one or more lower ground rings disposed around or about one or more vias of the second one or more signal vias in the lower portion of the package board, the one or more lower ground rings coupled to one of more vias of the first set of second ground vias and to the ground interface plane, the one or more lower ground rings disposed vertically below the ground interface plane and above the plurality of contact pads,
        wherein the one or more upper ground rings comprise a ground ring disposed horizontally adjacent to the signal line, the ground ring disposed on both sides of the signal line, the ground ring disposed around an end of the signal line,
        wherein the bottom ground plane comprises ground contact pads of the plurality of contact pads.

12. The integrated circuit chip package of claim 1, wherein the second radius is greater than zero but not greater than a ball-to-ball pitch of the plurality of conductive balls.

13. The integrated circuit chip package of claim 1, wherein each of the one or more transition layers in the lower portion of the package board has a thickness that is between 0.1 mm and 0.2 mm.

14. The integrated circuit chip package of claim 1,
    wherein the one or more ground planes comprise:
        an upper ground plane disposed above the signal line within the upper portion of the package board;
        a lower ground plane disposed below the signal line within the upper portion of the package board;
        wherein a first one of the one or more transition layers in the upper portion of the package board is disposed between the upper ground plane and the signal line, and a second one of the one or more transition layers in the upper portion of the package board is disposed between the signal line and the lower ground plane, wherein each of the first one and the second one of the one or more transition layers within the upper portion of package board has a same thickness that is between 0.1 mm and 0.15 mm, wherein each of the one or more transition layers between the ground interface plane and the plurality of contact pads within the lower portion of package board has a same thickness that is between 0.1 mm and 0.15 mm, and wherein a region between the ground interface plane and the plurality of contact pads comprises four transition layers.

15. The integrated circuit chip package of claim 1, wherein the plurality of contact pads are arranged in greater than a ten-by-ten array of contact pads, and the ball grid array package is greater than 10 mm by 10 mm in area.

16. The integrated circuit chip package of claim 1, wherein each of the plurality of conductive balls measures between 0.3 mm and 1 mm in diameter.

17. The integrated circuit chip package of claim 1, wherein the plurality of conductive balls are positioned with a ball-to-ball pitch of between 0.5 mm and 1.5 mm.

\* \* \* \* \*